(12) United States Patent
Jo et al.

(10) Patent No.: US 11,276,747 B2
(45) Date of Patent: Mar. 15, 2022

(54) DISPLAY DEVICE

(71) Applicant: Samsung Display Co., Ltd., Yongin-si (KR)

(72) Inventors: Kangmoon Jo, Yongin-si (KR); Dongwoo Kim, Yongin-si (KR); Sungjae Moon, Yongin-si (KR); Junhyun Park, Yongin-si (KR); Ansu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/194,921

(22) Filed: Mar. 8, 2021

(65) Prior Publication Data

US 2021/0193788 A1 Jun. 24, 2021

Related U.S. Application Data

(63) Continuation of application No. 16/595,830, filed on Oct. 8, 2019, now Pat. No. 10,943,970.

(30) Foreign Application Priority Data

Oct. 10, 2018 (KR) ........................ 10-2018-0120604

(51) Int. Cl.
*H01L 27/32* (2006.01)
*G09G 3/36* (2006.01)
*H01L 27/12* (2006.01)

(52) U.S. Cl.
CPC ....... *H01L 27/3276* (2013.01); *G09G 3/3688* (2013.01); *H01L 27/3248* (2013.01);
(Continued)

(58) Field of Classification Search
CPC .... G06F 3/0321; G06F 3/03545; G06F 3/041; G06F 3/0416; G06F 3/044; G06F 3/0442; G06F 3/0445; G06F 3/0446; G06F 3/0448
(Continued)

(56) References Cited

U.S. PATENT DOCUMENTS

2002/0104995 A1* 8/2002 Yamazaki ........... H01L 27/1255
257/72
2005/0200790 A1 9/2005 Konno et al.
(Continued)

FOREIGN PATENT DOCUMENTS

KR 10-2018-0024909 3/2018
KR 10-2018-0024910 3/2018
(Continued)

*Primary Examiner* — Mark Edwards
(74) *Attorney, Agent, or Firm* — Kile Park Reed & Houtteman PLLC

(57) ABSTRACT

There is provided a display device. The display device includes a first data line on a first interlayer insulating layer over a substrate, a first power line and a second power line on a second interlayer insulating layer, the second interlayer insulating layer covering the first data line, and a plurality of pixels. A first pixel among the plurality of pixels includes a display element including a pixel electrode, an opposite electrode, and an intermediate layer between the pixel electrode and the opposite electrode, the second power line being connected to the opposite electrode, and a driving thin film transistor between the substrate and the display element and including a driving semiconductor layer, a driving gate electrode, a driving source electrode, and a driving drain electrode, the first interlayer insulating layer covering the driving gate electrode, and the first power line being connected to the driving source electrode.

8 Claims, 16 Drawing Sheets

(52) U.S. Cl.
CPC ...... *H01L 27/3258* (2013.01); *H01L 27/3262* (2013.01); *H01L 27/3265* (2013.01); *G09G 2300/0842* (2013.01); *G09G 2310/0262* (2013.01); *H01L 27/1214* (2013.01)

(58) Field of Classification Search
USPC .......................................................... 345/211
See application file for complete search history.

(56) References Cited

U.S. PATENT DOCUMENTS

| | | |
|---|---|---|
| 2015/0255017 A1 | 9/2015 | Kim |
| 2016/0035274 A1 | 2/2016 | Kwon et al. |
| 2017/0110522 A1 | 4/2017 | Lee et al. |
| 2017/0125506 A1 | 5/2017 | Kim |
| 2017/0141177 A1 | 5/2017 | Kim et al. |
| 2017/0146861 A1 | 5/2017 | Takeshita et al. |
| 2017/0317155 A1* | 11/2017 | Oh ...................... H01L 27/1255 |
| 2018/0052552 A1 | 2/2018 | Tsai |
| 2018/0061314 A1 | 3/2018 | Kim |
| 2018/0061908 A1 | 3/2018 | Shim et al. |
| 2018/0122888 A1 | 5/2018 | Jung et al. |
| 2018/0261797 A1* | 9/2018 | Lee ...................... H01L 27/3218 |

FOREIGN PATENT DOCUMENTS

| | | |
|---|---|---|
| KR | 10-2018-0047540 | 5/2018 |
| KR | 10-2018-0047579 | 5/2018 |

* cited by examiner

DISPLAY DEVICE

CROSS-REFERENCE TO RELATED APPLICATION(S)

This is a continuation application of U.S. patent application Ser. No. 16/595,830 filed Oct. 8, 2019 (now pending), the disclosure of which is incorporated herein by reference in its entirety. U.S. patent application Ser. No. 16/595,830 claims priority benefit of Korean Patent Application 10-2018-0120604 filed Oct. 10, 2018 in the Korean Intellectual Property Office, the disclosure of which is incorporated herein by reference in its entirety for all purposes.

BACKGROUND

1. Field

Embodiments relate to a display device.

2. Description of the Related Art

A display device may be used for visually displaying information. The purposes of the display device have become more diversified. Also, as display devices have become thinner and more lightweight, their range of use has gradually been extended.

SUMMARY

Embodiments are directed to a display device, including a first data line on a first interlayer insulating layer over a substrate, a first power line and a second power line on a second interlayer insulating layer, the second interlayer insulating layer covering the first data line, and a plurality of pixels. A first pixel among the plurality of pixels includes a display element including a pixel electrode, an opposite electrode, and an intermediate layer between the pixel electrode and the opposite electrode, the second power line being connected to the opposite electrode, and a driving thin film transistor between the substrate and the display element and including a driving semiconductor layer, a driving gate electrode, a driving source electrode, and a driving drain electrode, the first interlayer insulating layer covering the driving gate electrode, and the first power line being connected to the driving source electrode.

The display device may further include a storage capacitor including a first electrode and a second electrode. The first electrode may extend from the driving gate electrode, and the second electrode may be on the first interlayer insulating layer and overlapping the first electrode.

The display device may further include a bias electrode between the substrate and the driving semiconductor layer and overlapping the driving semiconductor layer.

The display device may further include a sensing thin film transistor over the substrate and including a sensing semiconductor layer, a sensing gate electrode, a sensing source electrode, and a sensing drain electrode. The bias electrode may be electrically connected to the sensing source electrode.

The bias electrode may overlap the storage capacitor, the first electrode and the second electrode may constitute a first capacitance, and the bias electrode and the first electrode may constitute a second capacitance.

The display device may further include a planarization layer covering the first power line and the second power line. The pixel electrode may be on the planarization layer and may be electrically connected to the driving thin film transistor through a first via hole defined in the planarization layer, and the second power line may be connected to the opposite electrode through a second via hole defined in the planarization layer.

An area of the second via hole may be greater than an area of the first via hole.

The pixel electrode may include a groove corresponding to a shape of the second via hole.

The display device may further include a second pixel that neighbors the first pixel, and a second data line over the first pixel and the second pixel and in the same layer as a layer of the first data line. The first data line may be electrically connected to the first pixel, and the second data line may be electrically connected to the second pixel.

At least one of the first power line and the second power line may overlap the first data line.

Widths of the first power line and the second power line in a first direction may be greater than a width of the first data line in the first direction.

The pixel electrode may overlap the driving thin film transistor and may include a reflective layer.

The pixel electrode may not overlap the driving thin film transistor, and the opposite electrode may include a reflective layer.

The driving semiconductor layer may include an oxide semiconductor.

The display device may further include a switching thin film transistor over the substrate, and a lower metal layer between the substrate and the switching thin film transistor.

Embodiments are also directed to a display device including a plurality of pixel circuits over a substrate, and a plurality of display elements respectively connected to the plurality of pixel circuits to implement an image, the display device including a scan line extending in a first direction and connected to the plurality of pixel circuits arranged in the first direction, a first data line, a second data line, and a reference voltage line, each extending in a second direction that intersects with the first direction, arranged over the scan line with a first interlayer insulating layer therebetween, and a first power line and a second power line, each extending in the second direction, arranged over the first data line, the second data line, and the reference voltage line with a second interlayer insulating layer therebetween, the first power line being electrically connected to a pixel electrode of the plurality of display elements, and the second power line being connected to an opposite electrode of the plurality of display elements.

The first data line and the second data line may be alternately connected to the plurality of pixel circuits arranged in the second direction.

The plurality of pixel circuits may include a first pixel circuit, a second pixel circuit, and a third pixel circuit that neighbor each other in the first direction, and the first power line may overlap a portion of the first pixel circuit, the second pixel circuit, and a portion of the third pixel circuit.

The second power line may be connected to the opposite electrode through a via hole defined in a planarization layer, and the via hole may overlap the reference voltage line.

The reference voltage line may be connected to a reference voltage connection line extending in the first direction through a contact hole, and the reference voltage connection line may be connected in common to three pixel circuits that neighbor each other.

Each of the pixel circuits may include three thin film transistors and one storage capacitor.

BRIEF DESCRIPTION OF THE DRAWINGS

Features will become apparent to those of skill in the art by describing in detail example embodiments with reference to the attached drawings in which.

DETAILED DESCRIPTION

Figure 1:
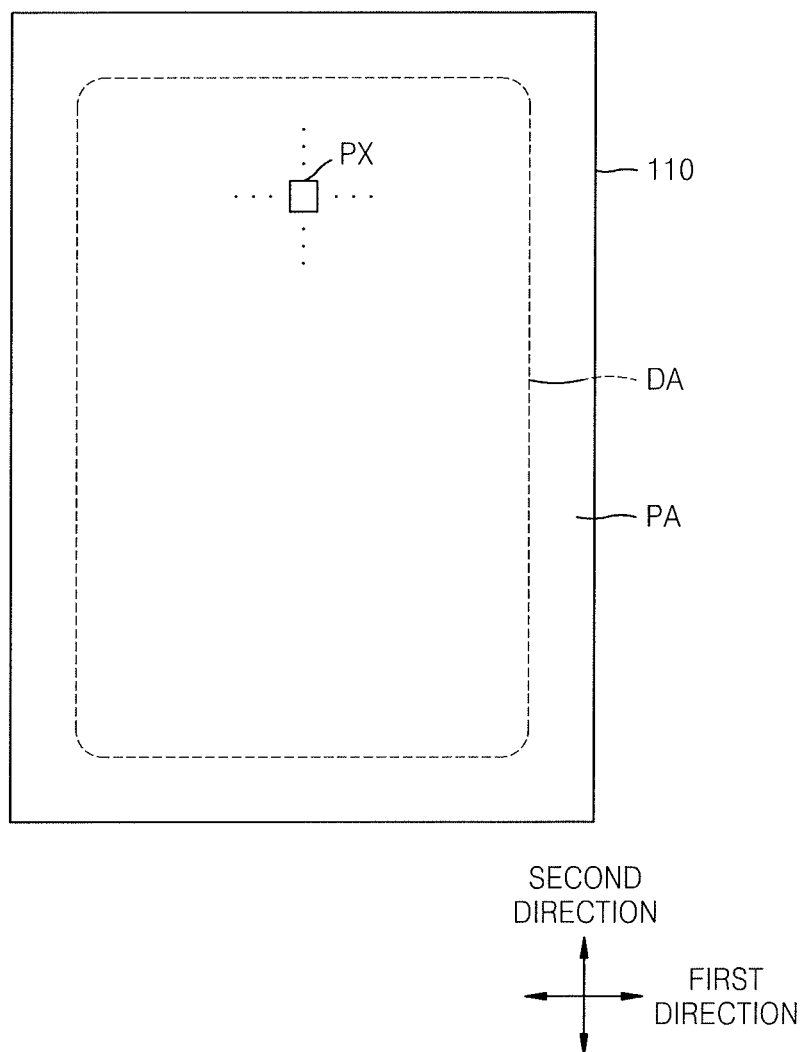
FIG. 1 illustrates a plan view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

Expressions such as "at least one of" when preceding a list of elements, modify the entire list of elements and do not modify the individual elements of the list.

It will be understood that although the terms "first", "second", etc., may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. Thus, e.g., intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly connected or electrically connected" to the other layer, region, or component or may be "indirectly connected or electrically connected" to other layer, region, or component with other layer, region, or component interposed therebetween.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

A display device may be an apparatus displaying an image and may include liquid crystal displays, electrophoretic displays, organic light-emitting displays, inorganic light-emitting displays, field emission displays, surface-conduction electron-emitter displays, plasma displays, and cathode ray displays. As an example, an organic light-emitting display device is exemplarily described below as a display device.

FIG. 1 is a plan view of a display device according to an example embodiment.

Referring to FIG. 1, the display device includes a display area DA and a peripheral area PA, which is a non-display area around the display area DA. The peripheral area PA may be an area that does not provide an image. The display area DA includes pixels PX each including a display element to provide a predetermined image.

Each of the pixels PX emits, e.g., red, green, blue, or white light and may include, e.g., an organic light-emitting diode (OLED). Also, each pixel PX may further include a device such as a thin film transistor (TFT) and a storage capacitor. A pixel PX may denote a sub-pixel that emits red, green, blue, or white light.

Controllers, such as a scan driver and a data driver each configured to apply an electric signal to the pixels PX of the display area DA, may be arranged in the peripheral area PA. A pad unit connected to a printed circuit board on which the controllers are mounted may be arranged in the peripheral area PA.

Figure 2:
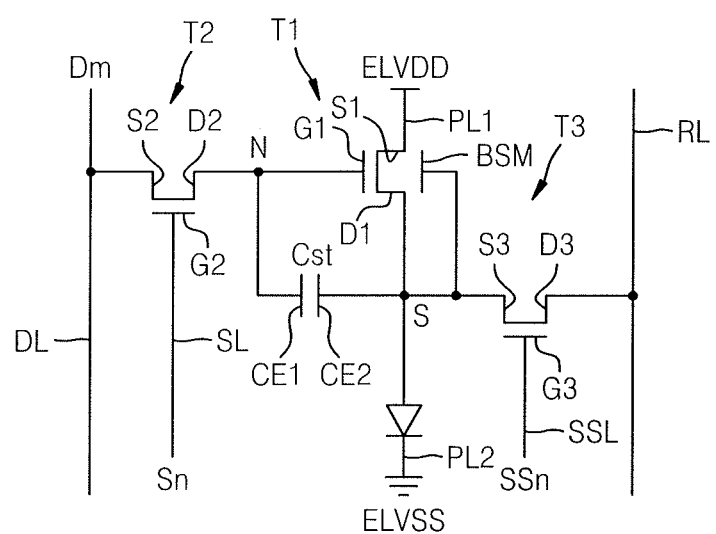
FIG. 2 illustrates an equivalent circuit diagram of one of the pixels of the display device of FIG. 1.

FIG. 2 is an equivalent circuit diagram of one of the pixels of the display device of FIG. 1.

Referring to FIG. 2, each pixel PX may include an OLED and a pixel circuit PC including a plurality of TFTs that drive the OLED. The pixel circuit PC may include a driving TFT T1, a switching TFT T2, a sensing TFT T3, and a storage capacitor Cst. In other embodiments, the number of TFTs and the number of storage capacitors included in the pixel circuit PC, or a structure of the pixel circuit PC may be variously modified.

A scan line SL may be connected to a gate electrode G2 of the switching TFT T2, a data line DL may be connected to a source electrode S2 of the switching TFT T2, and a first electrode CE1 of the storage capacitor Cst may be connected to a drain electrode D2 of the switching TFT T2.

The switching TFT T2 may supply a data voltage (a data signal) Dm of the data line DL to a first node N in response to a scan signal Sn from the scan line SL of each pixel PX.

A gate electrode G1 of the driving TFT T1 may be connected to the first node N, a source electrode S1 of the driving TFT T1 may be connected to a first power line PL1 configured to transfer a driving power voltage ELVDD, and a drain electrode D1 of the driving TFT T1 may be connected to an anode electrode of the OLED.

The driving TFT T1 may adjust an amount of a current flowing through the OLED depending on a gate-source voltage (Vgs) of the driving TFT T1, e.g., a voltage applied between the first power line PL1 and the first node N.

A gate electrode G3 of the sensing TFT T3 may be connected to a sensing control line SSL, a source electrode S3 of the sensing TFT T3 may be connected to a second node S, and a drain electrode D3 of the sensing TFT T3 may be connected to a reference voltage line RL. In an example embodiment, the sensing TFT T3 may be controlled by the scan line SL instead of the sensing control line SSL.

The sensing TFT T3 may sense an electric potential of an anode electrode of the OLED. The sensing TFT T3 may supply a pre-charging voltage from the reference voltage line RL to the second node S in response to a sensing signal SSn from the sensing control line SSL, or supply a voltage of the anode electrode of the OLED to the reference voltage line RL via the second node S during a sensing period.

The first electrode CE1 of the storage capacitor Cst may be connected to the first node N, and a second electrode CE2 of the storage capacitor Cst may be connected to the second node S. The storage capacitor Cst may be charged based on a voltage difference between voltages that are respectively supplied to the first node N and the second node S, and may supply a driving voltage to the driving TFT T1. For example, the storage capacitor Cst may be charged with a voltage difference between a data voltage Dm and a pre-charging voltage (Vpre) that are respectively supplied to the first node N and the second node S.

A bias electrode BSM may be formed to face the driving TFT T1 and connected to the source electrode S3 of the sensing TFT T3. The bias electrode BSM may receive a voltage by cooperating with an electric potential of the source electrode S3 of the sensing TFT T3. Thus, the driving TFT T1 may be stabilized. In an example embodiment, the bias electrode BSM may not be connected to the source electrode S3 of the sensing TFT T3 and may be connected to a separate bias wiring.

An opposite electrode (e.g., a cathode) of the OLED may receive a common power voltage ELVSS via a second power line PL2. The OLED may emit light based on a driving current from the driving TFT T1.

As an example, FIG. 2 shows the case where each pixel PX includes the signal lines SL, SSL, and DL, the reference voltage line RL, the first power line PL1, and the second power line PL2. In another implementation, at least one of the signal lines SL, SSL, and DL, and the reference voltage line RL, the first power line PL1, and the second power line PL2 may be shared by neighboring pixels.

Figure 3:
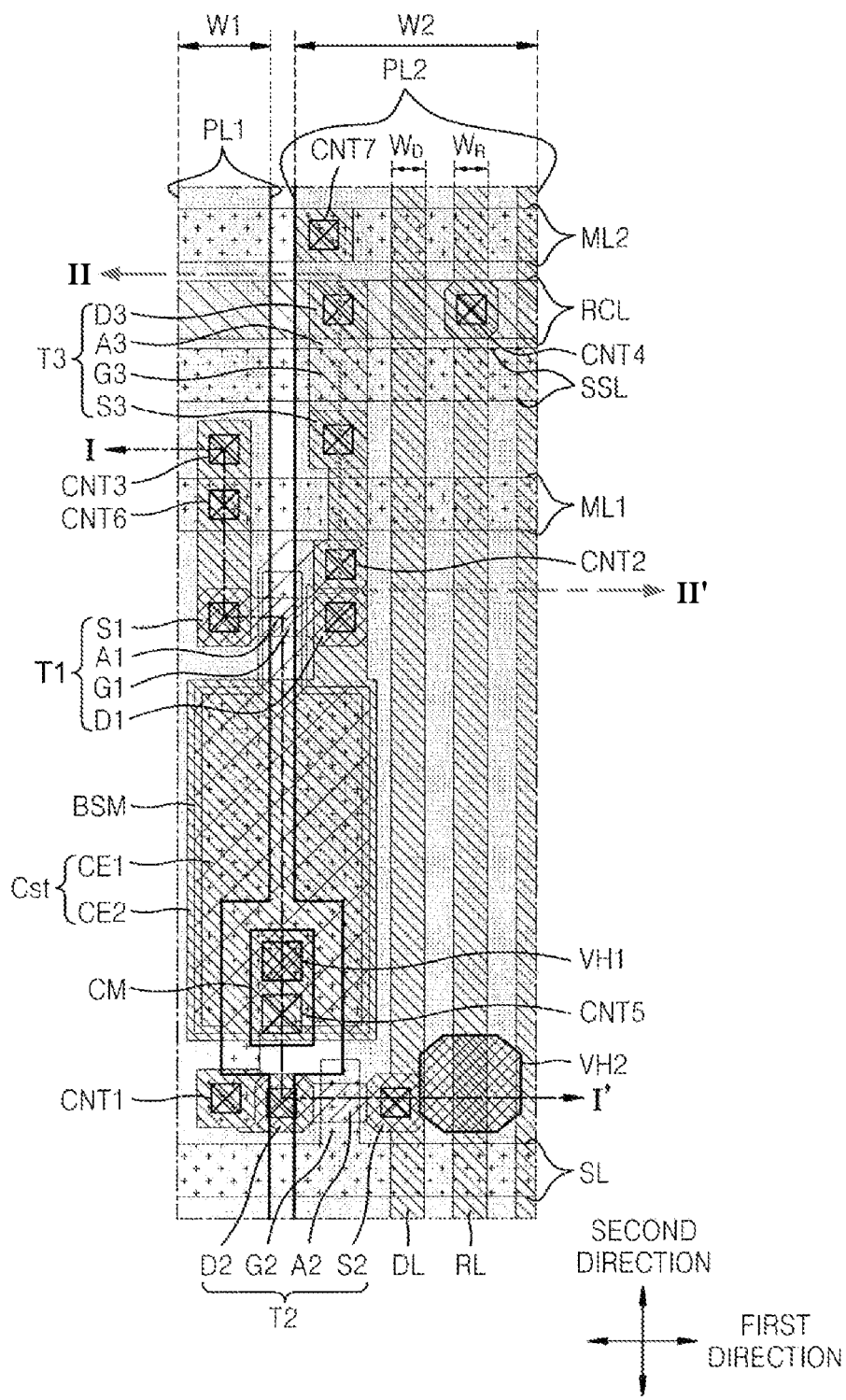
FIG. 3 illustrates a view of locations of wirings, a plurality of thin film transistors, a capacitor, etc., of a pixel circuit of FIG. 2.
Figure 4:
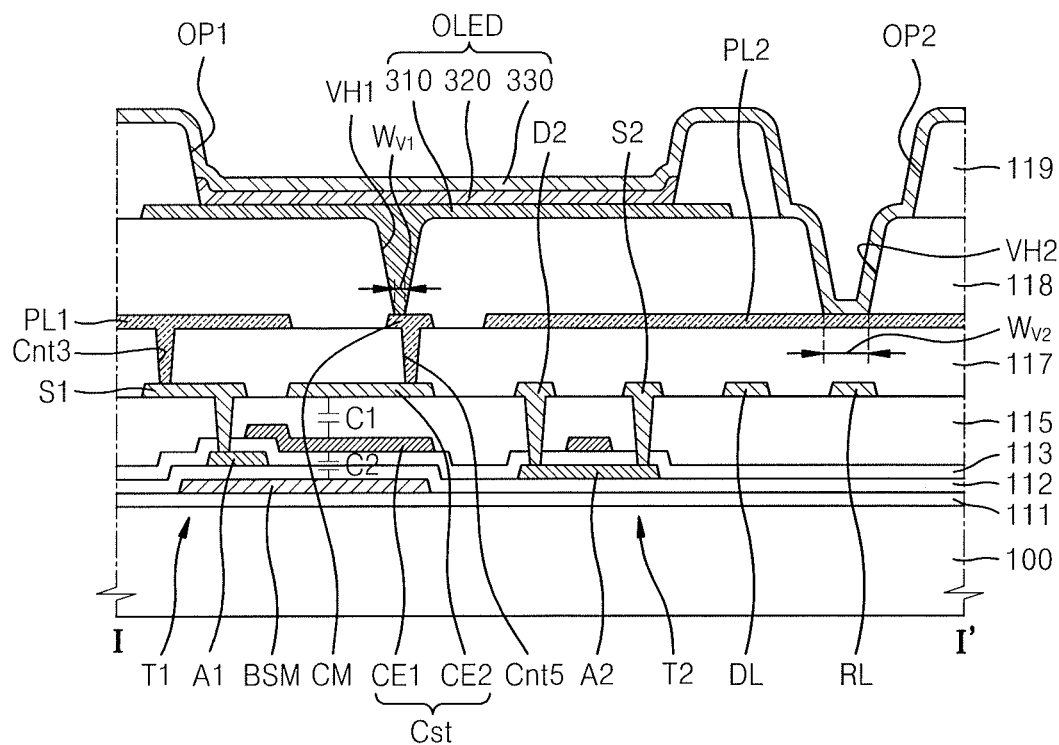
FIG. 4 illustrates a cross-sectional view of a structure including an organic light-emitting diode taken along line I-I' of FIG. 3.
Figure 5:
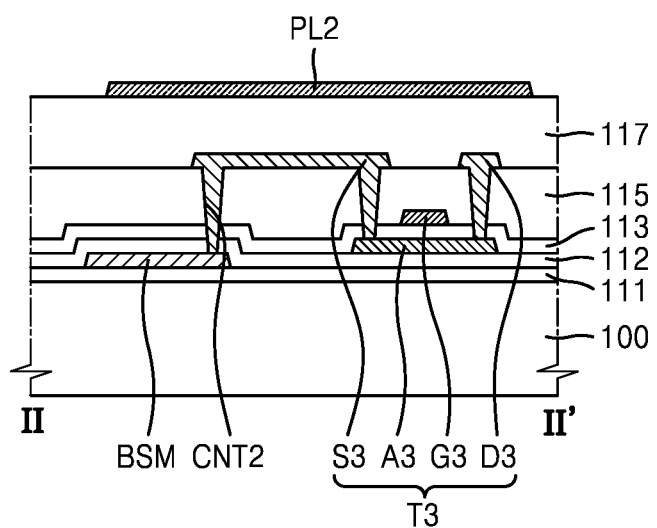
FIG. 5 illustrates a cross-sectional view taken along line II-II' of FIG. 3.

FIG. 3 is a view of locations of wirings, a plurality of thin film transistors and a capacitor of a pixel circuit PC according to an example embodiment, FIG. 4 is a cross-sectional view of a structure including an OLED taken along line I-I' of FIG. 3, and FIG. 5 is a cross-sectional view taken along line II-IP of FIG. 3.

Referring to FIG. 3, the pixel circuit PC of a display device according to the present example embodiment may be connected to the scan line SL, the sensing control line SSL, a first mesh line ML1, a second mesh line ML2, and a reference voltage connection line RCL, each extending in a first direction.

The pixel circuit PC may be connected to the data line DL, the reference voltage line RL, the first power line PL1, and the second power line PL2, each extending in a second direction that intersects with the first direction.

In the present example embodiment, the scan line SL, the sensing control line SSL, the first mesh line ML1, and the second mesh line ML2 may be arranged in the same layer. The data line DL and the reference voltage line RL may be arranged in the same layer and may be arranged over the scan line SL with a first interlayer insulating layer 115 (see FIG. 4) therebetween. Also, the first power line PL1 and the second power line PL2 may be arranged over the data line DL with a second interlayer insulating layer 117 therebetween.

In the present example embodiment, the reference voltage connection line RCL may be arranged in the same layer as a layer of a semiconductor layer. The reference voltage connection line RCL may be arranged in the same layer as a layer of the scan line SL. The first mesh line ML1 and/or the second mesh line ML2 may be omitted.

The pixel circuit PC may include the driving TFT T1, the switching TFT T2, the sensing TFT T3, and the storage capacitor Cst.

Semiconductor layers A1, A2, and A3 (respectively of the driving TFT T1, the switching TFT T2, and the sensing TFT T3) may be arranged in a same layer and include a same material. For example, all of the semiconductor layers A1, A2, and A3 may include amorphous silicon or polycrystalline silicon. Also, the semiconductor layers A1, A2, and A3 may include an oxide semiconductor material including an oxide of at least one of In, Ga, Sn, Zr, V, Hf, Cd, Ge, Cr, Ti, Al, Cs, Ce, and Zn. In an example embodiment, the semiconductor layers A1, A2, and A3 may include, as a Zn oxide-based material, Zn oxide, In—Zn oxide, and Ga—In—Zn oxide. In an example embodiment, the semiconductor layers A1, A2, and A3 may include a semiconductor including IGZO(In—Ga—Zn—O), ITZO(In—Sn—Zn—O), or IGTZO(In—Ga—Sn—Zn—O) in which ZnO contains metal such as In, Ga, or Sn. The semiconductor layers A1, A2, and A3 may include a single layer or a multi-layer.

The semiconductor layers A1, A2, and A3 may include a channel region, and may include a source region and a drain region on two opposite sides of the channel region. The source region and the drain region may include a carrier concentration-adjusted region. For example, in the case where the semiconductor layers A1, A2, and A3 include silicon, the source region and the drain region may be doped with impurities. For another example, in the case where the semiconductor layers A1, A2, and A3 include an oxide semiconductor, the source region and the drain region may include a region whose carrier concentration has been raised by a plasma process.

The gate electrodes G1, G2, and G3 may respectively overlap the channel regions of the semiconductor layers A1, A2, and A3 with a gate insulating layer 113 (see FIG. 4)

therebetween. The source electrodes S1, S2, and S3 and the drain electrodes D1, D2, and D3 arranged on the first interlayer insulating layer 115 may be respectively connected to the source region and the drain region through contact holes.

The gate electrode G1 of the driving TFT T1 may have an island shape. The gate electrode G1 may serve as the gate electrode G1 of the driving TFT T1 and may serve as the first electrode CE1 of the storage capacitor Cst. Thus, the gate electrode G1 may be formed as one body with the first electrode CE1 of the storage capacitor Cst. A portion of the gate electrode G1 may overlap the semiconductor layer A1 of the driving TFT T1, and another portion of the gate electrode G1 may overlap the second electrode CE2 of the storage capacitor Cst to constitute a first capacitance C1 (see FIG. 4). In another implementation, the first electrode CE1 of the storage capacitor Cst may be understood to extend from the gate electrode G1 that overlaps the semiconductor layer A1 of the driving TFT T1.

A bias electrode BSM may be arranged below the driving TFT T1 to correspond to the gate electrode G1 and the first electrode CE1 of the storage capacitor Cst. The first electrode CE1 and the bias electrode BSM may constitute a second capacitance C2 (see FIG. 4). One end of the gate electrode G1 may be connected to the drain electrode D2 of the switching TFT T2 through a first node contact hole CNT1.

The gate electrode G2 of the switching TFT T2 may be provided as a portion of the scan line SL. Thus, the gate electrode G2 may be provided as a region that protrudes in the second direction from the scan line SL that extends in the first direction. Accordingly, a scan signal Sn from the scan line SL may be transferred to the gate electrode G2, and the switching TFT T2 may be operated in response to the scan signal Sn.

The gate electrode G3 of the sensing TFT T3 may be provided as a portion of the sensing control line SSL. Thus, the sensing control line SSL may overlap the semiconductor layer A3 of the sensing TFT T3, and the overlapped region may serve as the gate electrode G3. Accordingly, a sensing signal SSn transferred from the sensing control line SSL may be transferred to the gate electrode G3, and the sensing TFT T3 may operate in response to the sensing signal SSn.

The drain electrode D1 of the driving TFT T1 may be provided as one body with the second electrode CE2 of the storage capacitor Cst and the source electrode S3 of the sensing TFT T3 and connected to the bias electrode BSM through a second node contact hole CNT2. The source electrode S1 of the driving TFT T1 may be connected to the first power line PL1 through a contact hole CNT3.

The source electrode S2 of the switching TFT T2 may be provided as a portion of the data line DL and may transfer a data signal Dm of the data line DL to a source region of the switching TFT T2. One end of the drain electrode D2 of the switching TFT T2 may be connected to the first electrode CE1 of the storage capacitor Cst through the first node contact hole CNT1.

The source electrode S3 of the sensing TFT T3 may be connected to the drain electrode D1 of the driving TFT T1, and the drain electrode D3 may be arranged to correspond to a drain region of the semiconductor layer A3 of the sensing TFT T3. The drain region may be formed in a portion of the reference voltage connection line RCL arranged in the same layer as a layer of the semiconductor layer A3. The reference voltage connection line RCL may be connected to the reference voltage line RL through a contact hole CNT4.

The first electrode CE1 of the storage capacitor Cst may be formed as one body with the gate electrode G1, and the second electrode CE2 may overlap the first electrode CE1 with the first interlayer insulating layer 115 (see FIG. 4) therebetween. The second electrode CE2 may be connected to a connection electrode CM arranged thereover through a contact hole CNT5. The connection electrode CM may be connected to the pixel electrode 310 (see FIG. 4) of the OLED through a first via hole VH1. The connection electrode CM may be arranged in an island shape in the same layer as a layer of the first power line PL1 and the second power line PL2. The connection electrode CM may be spaced apart from the first power line PL1 and the second power line PL2.

The bias electrode BSM may be arranged between a first buffer layer 111 (see FIG. 4) and a second buffer layer 112 (see FIG. 4) below the first electrode CE1 of the storage capacitor Cst. The bias electrode BSM and the first electrode CE1 of the storage capacitor Cst may constitute the second capacitance C2. One end of the bias electrode BSM may be connected to the source electrode S3 of the sensing TFT T3. Thus, the bias electrode BSM may receive a voltage by cooperating with the voltage applied to the source electrode S3. A separate bias voltage may be provided to the bias electrode BSM, or a voltage may not be applied to the bias electrode BSM, for example.

The first power line PL1 and the second power line PL2 may extend in the second direction in the same layer. The first power line PL1 and the second power line PL2 may be voltage lines configured to respectively transfer different voltages. The first power line PL1 may transfer the driving power voltage ELVDD, and the second power line PL2 may transfer the common power voltage ELVSS.

The first power line PL1 may be connected to the first mesh line ML1 that extends in the first direction through a contact hole CNT6. The driving power voltage ELVDD may be provided in a mesh structure by the first power line PL1 that extends in the second direction and the first mesh line ML1 that extends in the first direction.

The second power line PL2 may be connected to the second mesh line ML2 that extends in the first direction through a contact hole CNT7. The common power voltage ELVSS may be provided in a mesh structure by the second power line PL2 that extends in the second direction and the second mesh line ML2 that extends in the first direction. In an example embodiment, the first mesh line ML1 and/or the second mesh line ML2 may be omitted.

The first power line PL1 may be connected to the source electrode S1 of the driving TFT T1 through the contact hole CNT3. The second power line PL2 may be connected to an opposite electrode 330 (see FIG. 4) of the OLED through a second via hole VH2.

The first power line PL1 and the second power line PL2 may be arranged in a layer different from those of the data line DL, the reference voltage line RL, and the second electrode CE2 of the storage capacitor Cst. Thus, widths of the first power line PL1 and the second power line PL2 may be easily adjusted.

In an example embodiment, at least one of the first power line PL1 and the second power line PL2 may overlap the storage capacitor Cst. In an example embodiment, at least one of the first power line PL1 and the second power line PL2 may overlap the data line DL. Though the drawing shows that the second power line PL2 overlaps the data line DL and the reference voltage line RL, the first power line PL1 may overlap the data line DL, for example.

In an example embodiment, widths W1 and W2 respectively of the first power line PL1 and/or the second power line PL2 in the first direction may be greater than widths of the first electrode CE1, the second electrode CE2 of the storage capacitor Cst and/or the bias electrode BSM in the first direction. In an example embodiment, the first power line PL1 or the second power line PL2 may cover a portion of the pixel circuit PC and at least a portion of a neighboring pixel circuit PC.

The widths W1 and W2, respectively, of the first power line PL1 and the second power line PL2 in the first direction may be greater than a width $W_D$ of the data line DL. The widths W1 and W2, respectively, of the first power line PL1 and the second power line PL2 in the first direction may be greater than a width $W_R$ of the reference voltage line RL. Therefore, an IR drop of the driving power voltage ELVDD or the common power voltage ELVSS may be minimized.

The first power line PL1 and the second power line PL2 may be provided to cover most of a region of one pixel circuit PC. In this case, the first power line PL1 and the second power line PL2 may serve as shielding plates against an external electric signal. The first power line PL1 and the second power line PL2 may cover only a portion of one pixel circuit PC by taking into account a parasitic capacitance.

In a display device according to an example embodiment, the pixel circuit PC having the same shape described with reference to FIG. 3 may be arranged as a plurality of pixel circuits PC having configurations in which the pixel circuit PC is parallel-moved in the first direction and the second direction. The pixel circuit PC included in the display device according to an example embodiment may have a symmetric shape with a neighboring pixel circuit.

Hereinafter, a structure of a display device according to an example embodiment is described according to a stacking sequence. FIG. 4 mainly shows structures of the driving TFT T1, the switching TFT T2, and the storage capacitor Cst, and some elements may be omitted for clarity of description.

Referring to FIG. 4, at least one pixel of the display device according to the present example embodiment includes an OLED on a substrate 100. The OLED is a display element arranged over the substrate 100. The display device according to the present example embodiment includes the driving TFT T1, the first interlayer insulating layer 115 covering the gate electrode G1 of the driving TFT T1, the data line DL arranged on the first interlayer insulating layer 115, the second interlayer insulating layer 117 covering the data line DL, and the first power line PL1 and the second power line PL2 arranged on the second interlayer insulating layer 117. The first power line PL1 may be connected to the source electrode S1 of the driving TFT T1, and the second power line PL2 may be connected to the opposite electrode 330 of the OLED.

The display device according to the present example embodiment may further include the storage capacitor Cst connected to the driving TFT T1, and the bias electrode BSM arranged below the driving TFT T1.

The bias electrode BSM may overlap the storage capacitor Cst. The first electrode CE1 and the second electrode CE2 of the storage capacitor Cst may constitute the first capacitance C1. The first electrode CE1 and the bias electrode BSM may constitute the second capacitance C2.

The substrate 100 may include, e.g., a glass material, a ceramic material, a metal material, a flexible or bendable material. In the case where the substrate 100 is flexible or bendable, the substrate 100 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP). The substrate 100 may have a single-layered or multi-layered structure including the above materials. In the case where the substrate 100 has a multi-layered structure, the substrate 100 may further include an inorganic layer. In an example embodiment, the substrate 100 may have a structure of an organic material/inorganic material/organic material.

The first buffer layer 111 may increase planarization of a top surface of the substrate 100. The first buffer layer 111 may include, e.g., one or more of $SiO_2$, $SiN_x$, SiON, $Al_2O_3$, $TiO_2$, $Ta_2O_5$, $HfO_2$, or $ZnO_2$.

A barrier layer may be further arranged between the substrate 100 and the first buffer layer 111. The barrier layer may prevent or minimize penetration of impurities into the semiconductor layers A1 and A2 from the substrate 100, etc. The barrier layer may include, e.g., an inorganic material such as an oxide or a nitride, an organic material, or an organic/inorganic composite material. The barrier layer may have a single-layered or multi-layered structure.

The bias electrode BSM may be arranged on the first buffer layer 111 to correspond to the driving TFT T1 and the storage capacitor Cst. The bias electrode BSM may be connected to the source electrode S3 (see FIG. 5) of the sensing TFT T3 (see FIG. 5) and may receive a voltage of the source electrode S3. The bias electrode BSM may prevent external light from reaching the semiconductor layer A1, which may help stabilize operation of the driving TFT T1.

The second buffer layer 112 may cover the bias electrode BSM and may be formed over the entire surface of the substrate 100. The second buffer layer 112 may include, e.g., one or more of $SiO_2$, SiNx, SiON, $Al_2O_3$, $TiO_2$, $Ta_2O_5$, $HfO_2$, or $ZnO_2$.

The semiconductor layers A1 and A2 may be arranged on the second buffer layer 112. The semiconductor layers A1 and A2 may include, e.g., amorphous silicon or polycrystalline silicon. In another embodiment, the semiconductor layers A1 and A2 may include an oxide of one or more of, e.g., In, Ga, Sn, Zr, V, Hf, Cd, Ge, Cr, Ti, Al, Cs, Ce, or Zn. In an example embodiment, the semiconductor layers A1 and A2 may include, as a Zn oxide-based material, Zn oxide, In—Zn oxide, or Ga—In—Zn oxide. In another embodiment, the semiconductor layers A1 and A2 may include a semiconductor including IGZO (In—Ga—Zn—O), ITZO (In—Sn—Zn—O), or IGTZO (In—Ga—Sn—Zn—O) in which ZnO contains metal such as In, Ga, or Sn. The semiconductor layers A1 and A2 may include a channel region, and a source region, and a drain region arranged on two opposite sides of the channel region. The semiconductor layers A1 and A2 may include a single layer or a multi-layer.

The gate electrodes G1 and G2 may be respectively arranged over the semiconductor layers A1 and A2 with the gate insulating layer 113 therebetween. The gate electrodes G1 and G2 may include, e.g., one or more of Mo, Al, Cu, and Ti, and may include a single layer or a multi-layer. For example, each of the gate electrodes G1 and G2 may include a single layer including Mo.

The first electrode CE1 of the storage capacitor Cst may extend from the gate electrode G1 of the driving TFT T1. In another implementation, the first electrode CE1 of the storage capacitor Cst may be understood as being formed as one body with the gate electrode G1. The first electrode CE1 of the storage capacitor Cst may overlap the bias electrode BSM and the second capacitance C2 may be formed between the first electrode CE1 and the bias electrode BSM.

In this case, the second buffer layer 112 and the gate insulating layer 113 arranged between the first electrode CE1 and the bias electrode BSM may serve as a dielectric for the second capacitance C2.

The first interlayer insulating layer 115 may be provided to cover the gate electrodes G1 and G2. The first interlayer insulating layer 115 may include, e.g., one or more of $SiO_2$, SiNx, SiON, $Al_2O_3$, $TiO_2$, $Ta_2O_5$, $HfO_2$, or $ZnO_2$.

The second electrode CE2 of the storage capacitor Cst, the source electrodes S1 and S2, the drain electrode D2, the data line DL, and the reference voltage line RL may be arranged on the first interlayer insulating layer 115.

The second electrode CE2 of the storage capacitor Cst, the source electrodes S1 and S2, the drain electrode D2, the data line DL, and the reference voltage line RL may include a conductive material including, e.g., one or more of Mo, Al, Cu, and Ti, and may include a single layer or a multi-layer. For example, the second electrode CE2 of the storage capacitor Cst, the source electrodes S1 and S2, the drain electrode D2, the data line DL, and the reference voltage line RL may have a multi-layered structure of Ti/Al/Ti.

The second electrode CE2 of the storage capacitor Cst may overlap the first electrode CE1 with the first interlayer insulating layer 115 therebetween and may constitute the first capacitance C1. In this case, the first interlayer insulating layer 115 may serve as a dielectric layer of the storage capacitor Cst.

The source electrodes S1 and S2, and the drain electrode D2 may be respectively connected to the source regions and the drain region respectively of the semiconductor layers A1 and A2 through contact holes.

The second interlayer insulating layer 117 may be provided to cover the second electrode CE2 of the storage capacitor Cst, the source electrodes S1 and S2, the drain electrode D2, the data line DL, and the reference voltage line RL. The second interlayer insulating layer 117 may include, e.g., one or more of $SiO_2$, SiNx, SiON, $Al_2O_3$, $TiO_2$, $Ta_2O_5$, $HfO_2$, or $ZnO_2$.

The first power line PL1, the second power line PL2, and the connection electrode CM may be arranged on the second interlayer insulating layer 117. The first power line PL1, the second power line PL2, and the connection electrode CM may include a conductive material including one of Mo, Al, Cu, and Ti, and may include a single layer or a multi-layer including the above material.

The first power line PL1 may be connected to the source electrode S1 of the driving TFT T1 through the contact hole CNT3. The contact hole CNT3 may pass through the second interlayer insulating layer 117 and expose a portion of the source electrode S1. A portion of the first power line PL1 may fill the inside of the contact hole CNT3 and thus may be connected to the source electrode S1.

The first power line PL1 may overlap at least a portion of the driving TFT T1 and/or a portion of the storage capacitor Cst. The second power line PL2 may overlap at least a portion of each of the switching TFT T2, the data line DL, and the reference voltage line RL.

The connection electrode CM may be connected to the second electrode CE2 of the storage capacitor Cst through the contact hole CNT5. The contact hole CNT5 may pass through the second interlayer insulating layer 117 and expose a portion of the second electrode CE2. A portion of the connection electrode CM may be inserted into the contact hole CNT5 and connected to the second electrode CE2.

A planarization layer 118 may be arranged on the first power line PL1, the second power line PL2, and the connection electrode CM. An OLED may be located over the planarization layer 118.

The planarization layer 118 may include a single layer or a multi-layer including an organic material. The planarization layer 118 may include a polymer such as benzocyclobutene (BCB), polyimide, hexamethyldisiloxane (HMDSO), polymethylmethacrylate (PMMA), or polystyrene (PS), or polymer derivatives having, e.g., a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 118 may include an inorganic material. The planarization layer 118 may include one of $SiO_2$, SiNx, SiON, $Al_2O_3$, $TiO_2$, $Ta_2O_5$, $HfO_2$, and $ZnO_2$. In the case where the planarization layer 118 includes an inorganic material, chemical planarization polishing may be performed. The planarization layer 118 may include both an organic material and an inorganic material.

The OLED may be arranged on the planarization layer 118 in the display area DA of the substrate 100. The OLED may include the pixel electrode 310, an intermediate layer 320 including an organic emission layer, and the opposite electrode 330.

The first and second via holes VH1 and VH2 that respectively expose a portion of the connection electrode CM and a portion of the second power line PL2 may be formed in the planarization layer 118. The pixel electrode 310 may be connected to the connection electrode CM through the first via hole VH1. The connection electrode CM may be connected to the second electrode CE2 of the storage capacitor Cst, and the second electrode CE2 may be connected to the drain electrode D1 of the driving TFT T1 (see FIG. 3). Thus, the pixel electrode 310 may be electrically connected to the drain electrode D1 of the driving TFT T1.

The opposite electrode 330 may be connected to the second power line PL2 through the second via hole VH2. The intermediate layer 320 of the OLED may include a multi-layer and at least one layer of the intermediate layer 320 may be arranged in the second via hole VH2 during a process of forming the intermediate layer 320.

In an implementation, before the opposite electrode 330 is formed, any of the intermediate layer 320 that may remain inside the second via hole VH2 may be removed by irradiating a laser into the second via hole VH2. Also, a contact characteristic between the opposite electrode 330 and the second power line PL2 may be improved by irradiating a laser into the second via hole VH2 after the opposite electrode 330 is formed. In an example embodiment, an area of the second via hole VH2 may be greater than an area of the first via hole VH1. Thus, a width $W_{r2}$ of the second via hole VH2 may be greater than a width $W_{r1}$ of the first via hole VH1.

In the present example embodiment, the second power line PL2 is arranged on the second interlayer insulating layer 117, which is a higher layer than the first interlayer insulating layer 115 on which the data line DL is arranged. Thus, a laser irradiation process for a contact with the opposite electrode 330 may be easily performed.

The pixel electrode 310 may include a (semi)transmissive electrode or a reflective electrode. In an example embodiment, the pixel electrode 310 may include a reflective layer including, e.g., one of Ag, Mg, Al, Pt, Pd, Au, Ni, Nd, Ir, Cr, or a compound thereof, and a transparent or semi-transparent electrode layer on the reflective layer. The transparent or semi-transparent electrode layer may include, e.g., one or more of indium tin oxide (ITO), indium zinc oxide (IZO), zinc oxide (ZnO), indium oxide ($In_2O_3$), indium gallium oxide (IGO), or aluminum zinc oxide (AZO).

A pixel-defining layer 119 may be arranged on the planarization layer 118. The pixel-defining layer 119 may define an emission area of a pixel by including an opening corresponding to each sub-pixel in the display area DA, e.g., a first opening OP1 that exposes at least a central portion of the pixel electrode 310. The pixel-defining layer 119 may prevent an arc, etc. from occurring at an edge of the pixel electrode 310 by increasing a distance between the edge of the pixel electrode 310 and the opposite electrode 330 over the pixel electrode 310.

The pixel-defining layer 119 may include a second opening OP2 corresponding to the second via hole VH2 of the planarization layer 118. Laser irradiation into a region of the second via hole VH2 may be possible afterwards by exposing a portion of the second power line PL2 through the second opening OP2 and the second via hole VH2.

The pixel-defining layer 119 may be formed by a method such as spin coating using, e.g., one or more organic insulating materials such as polyimide, polyamide, an acrylic resin, BCB, or a phenolic resin.

The intermediate layer 320 of the OLED may include an organic emission layer. The organic emission layer may include an organic material including a fluorescent or phosphorescent material that emits, e.g., red, green, blue, or white light. The organic emission layer may include a low molecular weight or polymer organic material. A functional layer such as a hole transport layer (HTL), a hole injection layer (HIL), an electron transport layer (ETL), and an electron injection layer (EIL) may be selectively arranged under or on the organic emission layer. The intermediate layer 320 may correspond to each of a plurality of pixel electrodes 310. The intermediate layer 320 may include a layer that is one body over the plurality of pixel electrodes 310.

The opposite electrode 330 may include a light-transmissive electrode or a reflective electrode. In an example embodiment, the opposite electrode 330 may include a transparent or semi-transparent electrode and may include, e.g., a metal thin film having a small work function and including one or more of, e.g., Li, Ca, LiF/Ca, LiF/Al, Al, Ag, Mg, or a compound thereof. A transparent conductive oxide (TCO) layer such as ITO, IZO, ZnO, or $In_2O_3$ may be further arranged on the metal thin film. The opposite electrode 330 may be arranged over the display area DA and the peripheral area PA and arranged over the intermediate layer 320 and the pixel-defining layer 119. The opposite electrode 330 may be provided as one body over a plurality of OLEDs and may correspond to the plurality of pixel electrodes 310.

The opposite electrode 330 may be connected to the second power line PL2 through the second opening OP2 and the second via hole VH2.

The OLED may be susceptible to damage by external moisture or oxygen. Thus, a thin-film encapsulation layer may be arranged thereon and may cover and protect the OLED. The thin-film encapsulation layer may cover the display area DA and extend to the outside of the display area DA. The thin-film encapsulation layer may include, e.g., an inorganic encapsulation layer including at least one inorganic material and an organic encapsulation layer including at least one organic material. In an example embodiment, the thin-film encapsulation layer may have a structure including a first inorganic encapsulation layer/organic encapsulation layer/second inorganic encapsulation layer stacked therein.

A spacer, e.g., to prevent mask chopping, may be provided on the pixel-defining layer 119. Various functional layers such as a polarization layer configured to reduce external light reflection, a black matrix, a color filter, and/or a touchscreen including a touch electrode may be provided on the thin-film encapsulation layer.

FIG. 5 is a cross-sectional view of a portion taken along line II-II' of FIG. 3. FIG. 5 mainly shows a connection structure of the sensing TFT T3 and the bias electrode BSM, and some elements may be omitted.

Referring to FIG. 5, the sensing TFT T3 includes the semiconductor layer A3, the gate electrode G3, the source electrode S3, and the drain electrode D3. The gate electrode G3 overlaps the semiconductor layer A3 with the gate insulating layer 113 therebetween. The source electrode S3 and the drain electrode D3 may be arranged on the first interlayer insulating layer 115 and connected to the semiconductor layer A3 through contact holes.

The source electrode S3 and the drain electrode D3 may be covered by the second interlayer insulating layer 117, and the second power line PL2 may be arranged on the second interlayer insulating layer 117. The second power line PL2 may overlap the sensing TFT T3 and entirely cover the sensing TFT T3.

One end of the bias electrode BSM may be connected to the source electrode S3 of the sensing TFT T3 through the second node contact hole CNT2 that passes through the first interlayer insulating layer 115, the gate insulating layer 113, and the second buffer layer 112.

Figure 6:
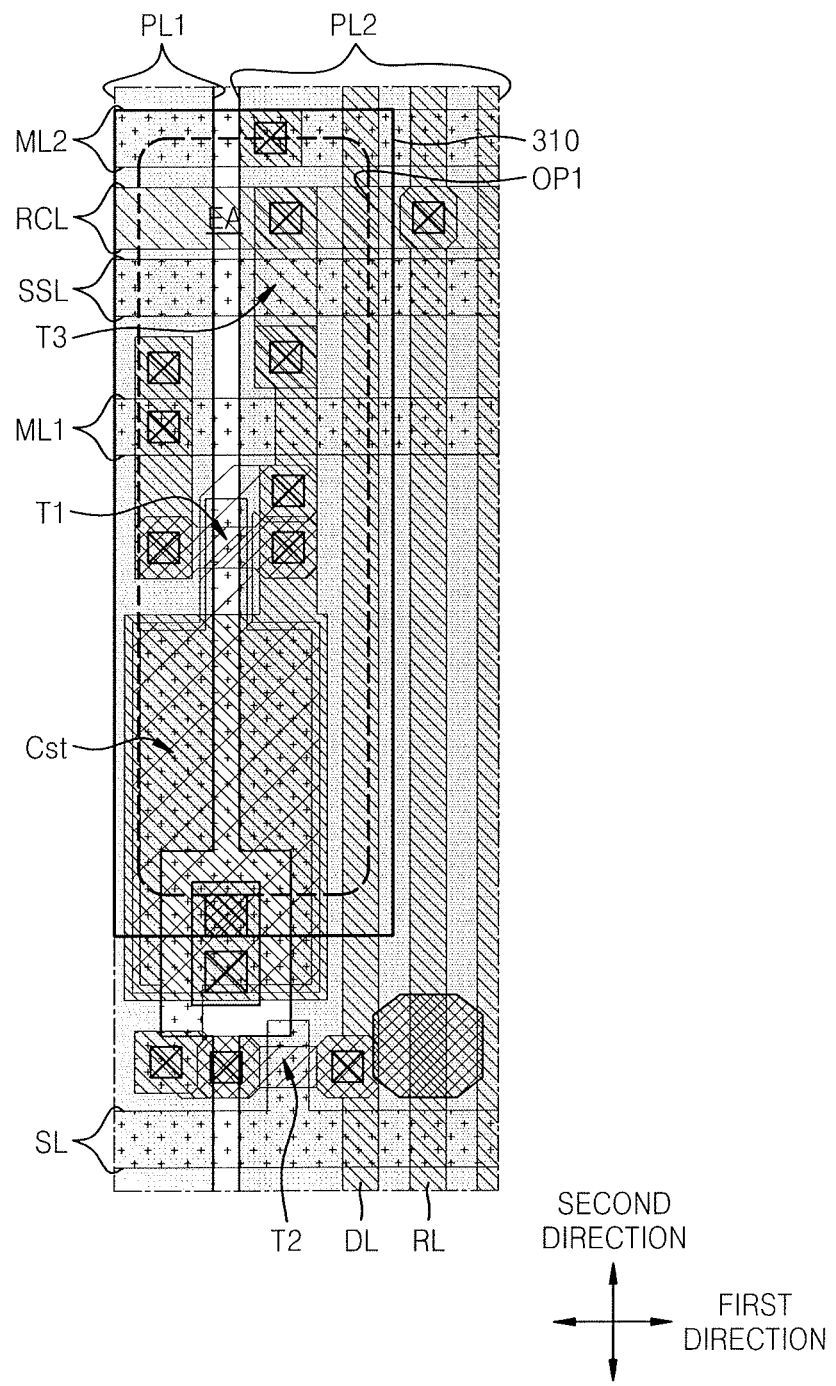
FIG. 6 illustrates a plan view of a display device according to another example embodiment.

FIG. 6 is a plan view of a display device according to another example embodiment. Specifically, FIG. 6 is a plan view of the arrangement in which the pixel electrode 310 and an emission area EA defined by the first opening OP1 are arranged in the pixel circuit PC of FIG. 3 according to an example embodiment.

Referring to FIG. 6, the pixel electrode 310 may overlap the driving TFT T1 and the storage capacitor Cst of the pixel circuit PC. Also, the pixel electrode 310 may overlap the first power line PL1 and the second power line PL2. The pixel electrode 310 is connected to the connection electrode CM through the first via hole VH1 and is connected to the storage capacitor Cst and the driving TFT T1 through the connection electrode CM. When the pixel circuit PC is driven, voltages may be respectively applied to the pixel electrode 310 and the opposite electrode 330 (see FIG. 4), and the OLED (see FIG. 4) may emit light. The emission area EA may be defined by the first opening OP1 of the pixel-defining layer 119.

The pixel electrode 310 may overlap the pixel circuit PC. Thus, the emission area EA may overlap the driving TFT T1 and the storage capacitor Cst of the pixel circuit PC, the first power line PL1, and the second power line PL2.

As an example, the pixel electrode 310 and the emission area EA are shown to have a rectangular shape or a rounded rectangular shape in the drawing. In other examples, the pixel electrode 310 and the emission area EA may have an irregular shape in which a recess is formed in its one edge. Also, the pixel electrode 310 may have various shapes such as a rhombic shape, a hexagonal shape, an octagonal shape, or a circular shape.

A structure in which the pixel electrode 310 and/or the emission area EA overlap the driving TFT T1 and the storage capacitor Cst of the pixel circuit PC may be applied to a top-emitting display device that emits light generated from the intermediate layer 320 (see FIG. 4) in a direction of the opposite electrode 330.

In this case, the pixel electrode 310 may be provided as a reflective electrode including a reflective layer. For example, the reflective layer may include one or more of Ag, Mg, Al, Pt, Pd, Au, Ni, Nd, Ir, or Cr. A transparent or semi-transparent electrode layer including, e.g., one or more of indium tin oxide (ITO), indium zinc oxide (IZO), zinc oxide (ZnO), indium oxide ($In_2O_3$), indium gallium oxide (IGO), or aluminum zinc oxide (AZO) may be further arranged on the reflective layer. According to an example embodiment, the pixel electrode 310 may include three layers of ITO/Ag/ITO.

In the present example embodiment, the opposite electrode 330 (see FIG. 4) may include a (semi)transparent electrode. For example, the opposite electrode 330 may include one or more of Ag, Al, Mg, Li, Ca, Cu, LiF/Ca, LiF/Al, MgAg, or CaAg and may include a thin film having a thickness ranging from several nm to tens of nm so as to transmit light.

Figure 7:
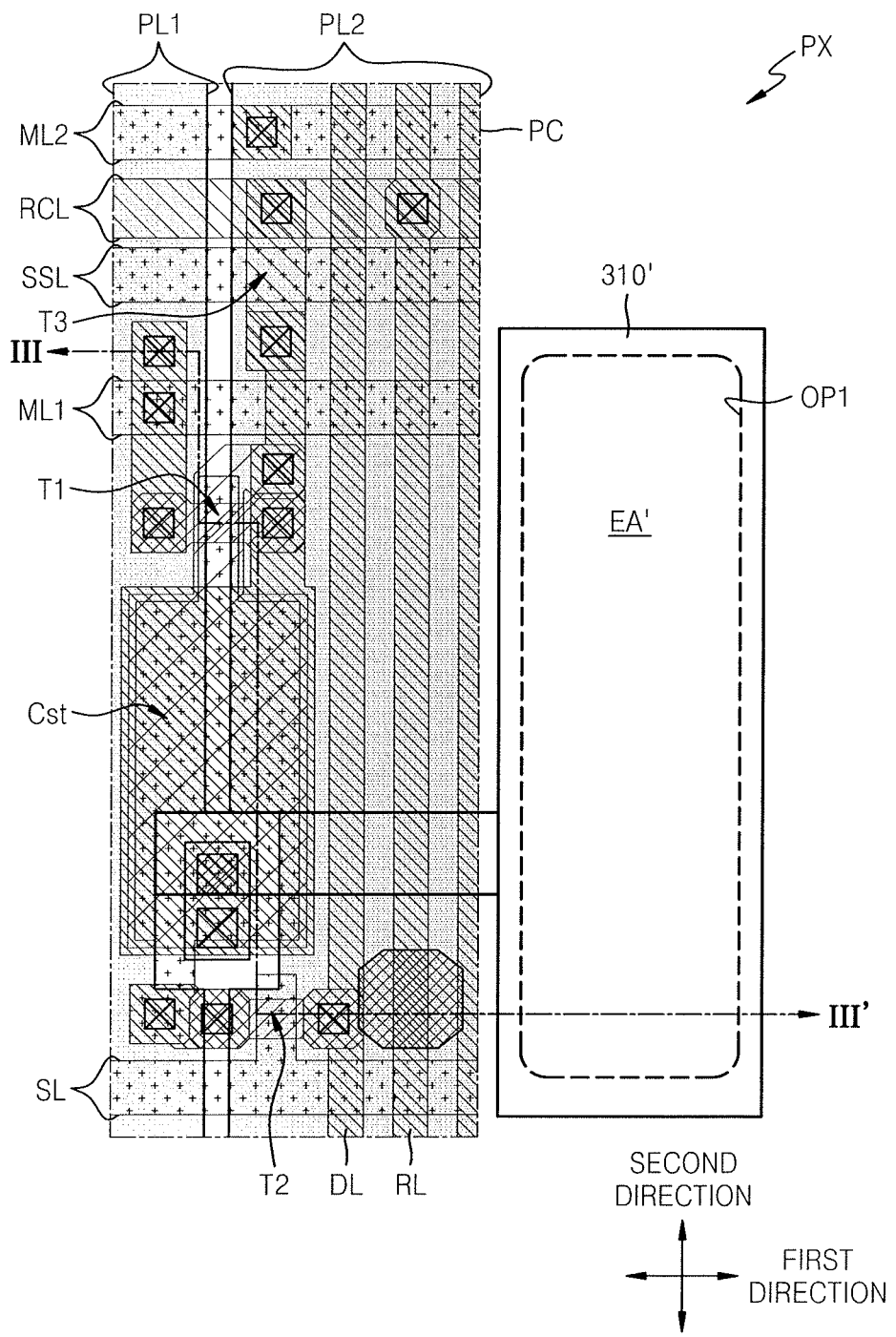
FIG. 7 illustrates a plan view of a display device according to another example embodiment.
Figure 8:
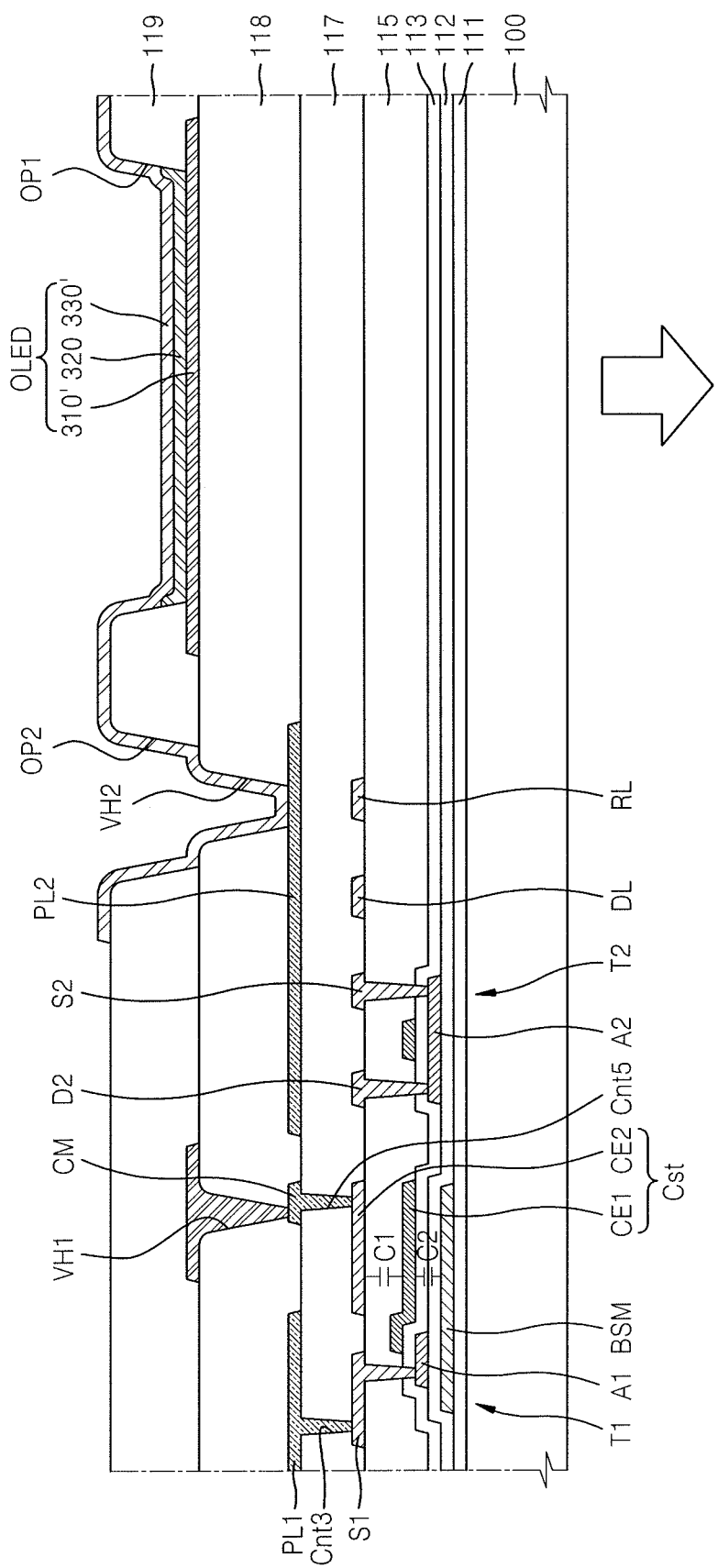
FIG. 8 illustrates a cross-sectional view of a display device according to another example embodiment.

FIGS. 7 and 8 are views of a display device according to another example embodiment. Specifically, FIG. 7 is a plan view showing that the pixel electrode 310' and an emission area EA' defined by the first opening OP1 is arranged in the pixel circuit PC of FIG. 3 according to an example embodiment, and FIG. 8 is a cross-sectional view taken along line of FIG. 7. In FIGS. 7 and 8, the same reference numerals as those of FIGS. 4 and 6 denote the same elements.

Referring to FIGS. 7 and 8, according to the present example embodiment, the emission area EA' of an OLED may not overlap the driving TFT T1 and the storage capacitor Cst of the pixel circuit PC. To connect the pixel electrode 310' of the OLED to the connection electrode CM, a portion of the pixel electrode 310' may overlap the pixel circuit PC. The emission area EA' defined by the first opening OP1 of the pixel-defining layer 119 may not overlap the driving TFT T1 and the storage capacitor Cst.

The above structure may be applied to a bottom emission-type display device that emits light generated from the OLED toward the substrate 100. The emission of light to a bottom surface of the substrate 100 may be enhanced by not arranging structures that block or change a light path in the emission area EA'.

In this case, a pixel electrode 310' may include a (semi) transparent electrode. For example, the pixel electrode 310' may include one or more of Ag, Al, Mg, Li, Ca, Cu, LiF/Ca, LiF/Al, MgAg, or CaAg and may include a thin film having a thickness ranging from several nm to tens of nm so as to transmit light.

As an example, the emission area EA' is shown to have a rectangular shape or a rounded rectangular shape in the drawing. In another example, the emission area EA' may have an irregular shape in which a recess is formed in its one edge. Also, the emission area EA' may have various shapes such as a rhombic shape, a hexagonal shape, an octagonal shape, or a circular shape.

In the present example embodiment, an opposite electrode 330' may be provided as a reflective electrode including a reflective layer. For example, the reflective layer may include one or more of Ag, Mg, Al, Pt, Pd, Au, Ni, Nd, Ir, or Cr. A transparent or semi-transparent electrode layer including, e.g., one or more of indium tin oxide (ITO), indium zinc oxide (IZO), zinc oxide (ZnO), indium oxide ($In_2O_3$), indium gallium oxide (IGO), or aluminum zinc oxide (AZO) may be further arranged on the reflective layer. According to an example embodiment, the opposite electrode 330' may include three layers of ITO/Ag/ITO. According to an example embodiment, an additional reflective layer may be further provided on the opposite electrode 330'.

In the present example embodiment, each of the planarization layer 118, the second interlayer insulating layer 117, the first interlayer insulating layer 115, the gate insulating layer 113, the second buffer layer 112, the first buffer layer 111, and the substrate 100 arranged below the OLED may include a transparent material.

In an example embodiment, a portion of at least one of the planarization layer 118, the second interlayer insulating layer 117, the first interlayer insulating layer 115, the gate insulating layer 113, the second buffer layer 112, and the first buffer layer 111 may be removed, the portion corresponding to the OLED.

Figure 9:
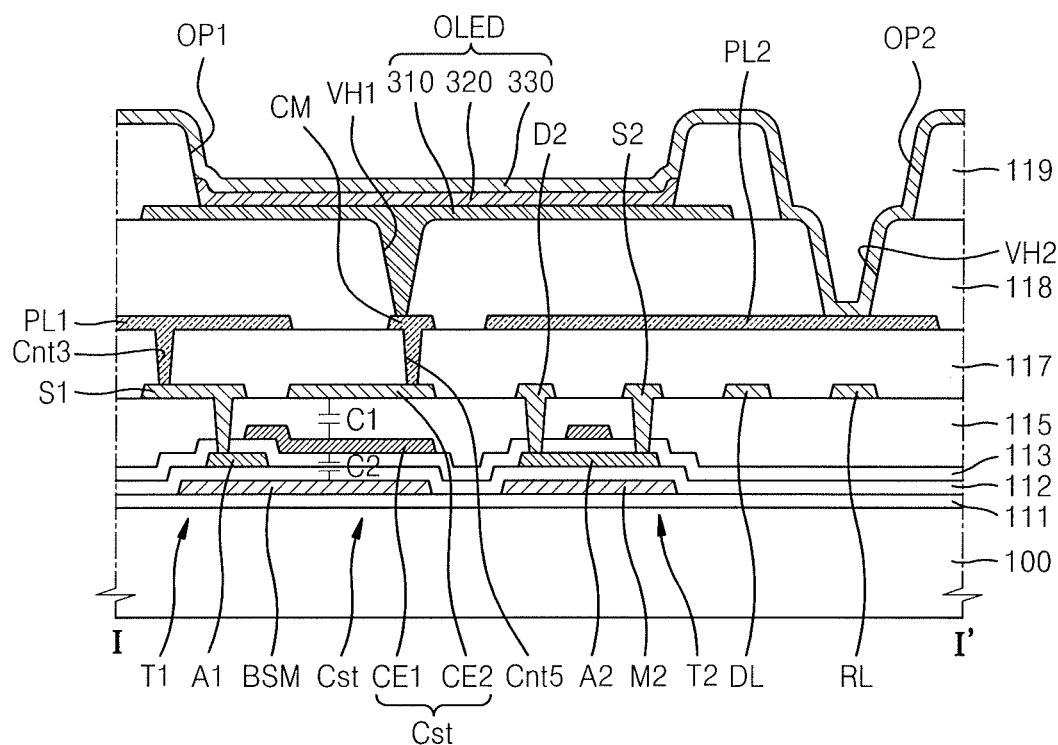
FIG. 9 illustrates a cross-sectional view of a display device according to another example embodiment.

FIG. 9 is a cross-sectional view of a display device according to another example embodiment.

Referring to FIG. 9, the display device according to an example embodiment includes the OLED (display element) arranged over the substrate 100, the driving TFT T1, the first interlayer insulating layer 115 covering the gate electrode G1 of the driving TFT T1, the data line DL on the first interlayer insulating layer 115, the second interlayer insulating layer 117 covering the data line DL, and the first power line PL1 and the second power line PL2 arranged on the second interlayer insulating layer 117. The first power line PL1 is connected to the source electrode S1 of the driving TFT T1, and the second power line PL2 is connected to the opposite electrode 330 of the OLED.

The display device according to an example embodiment may further include the storage capacitor Cst connected to the driving TFT T1, and the bias electrode BSM arranged under the driving TFT T1.

The bias electrode BSM may overlap the storage capacitor Cst. The first electrode CE1 and the second electrode CE2 of the storage capacitor Cst may constitute the first capacitance C1, and the first electrode CE1 and the bias electrode BSM may constitute the second capacitance C2.

In the display device according to the present embodiment, a lower metal layer M2 corresponding to the semiconductor layer A2 may be further arranged below the switching TFT T2. The lower metal layer M2 may be arranged between the substrate 100 and the semiconductor layer A2 and may block light that may be incident to the semiconductor layer A2. The lower metal layer M2 may be arranged in the same layer as a layer of the bias electrode BSM and may include the same material as that of the bias electrode BSM. For example, the lower metal layer M2 may include one or more of Mo, Al, Cu, or Ti, and may include a single layer or a multi-layer.

A characteristic of the semiconductor layer A2 may be changed by light and the characteristic change of the semiconductor layer A2 may cause a characteristic change of the switching TFT T2. In the present example embodiment, the lower metal layer M2 may stabilize the characteristic of the switching TFT T2 against being changed by external light.

In an example embodiment, a voltage may be applied to the lower metal layer M2, which may help stabilize the characteristic of the switching TFT T2.

In the present example embodiment, a voltage may be applied to one or more of the bias electrode BSM and the lower metal layer M2. For example, a voltage may be applied to the bias electrode BSM, and a voltage may not be applied to the lower metal layer M2. In another implementation, a first voltage may be applied to the bias electrode BSM, and a second voltage may be applied to the lower metal layer M2.

A sensing lower metal layer corresponding to the sensing TFT T3 may be further arranged below the sensing TFT T3. The sensing lower metal layer may be arranged in the same layer as a layer of the bias electrode BSM and may include a same material as that of the bias electrode BSM.

Figure 10A:
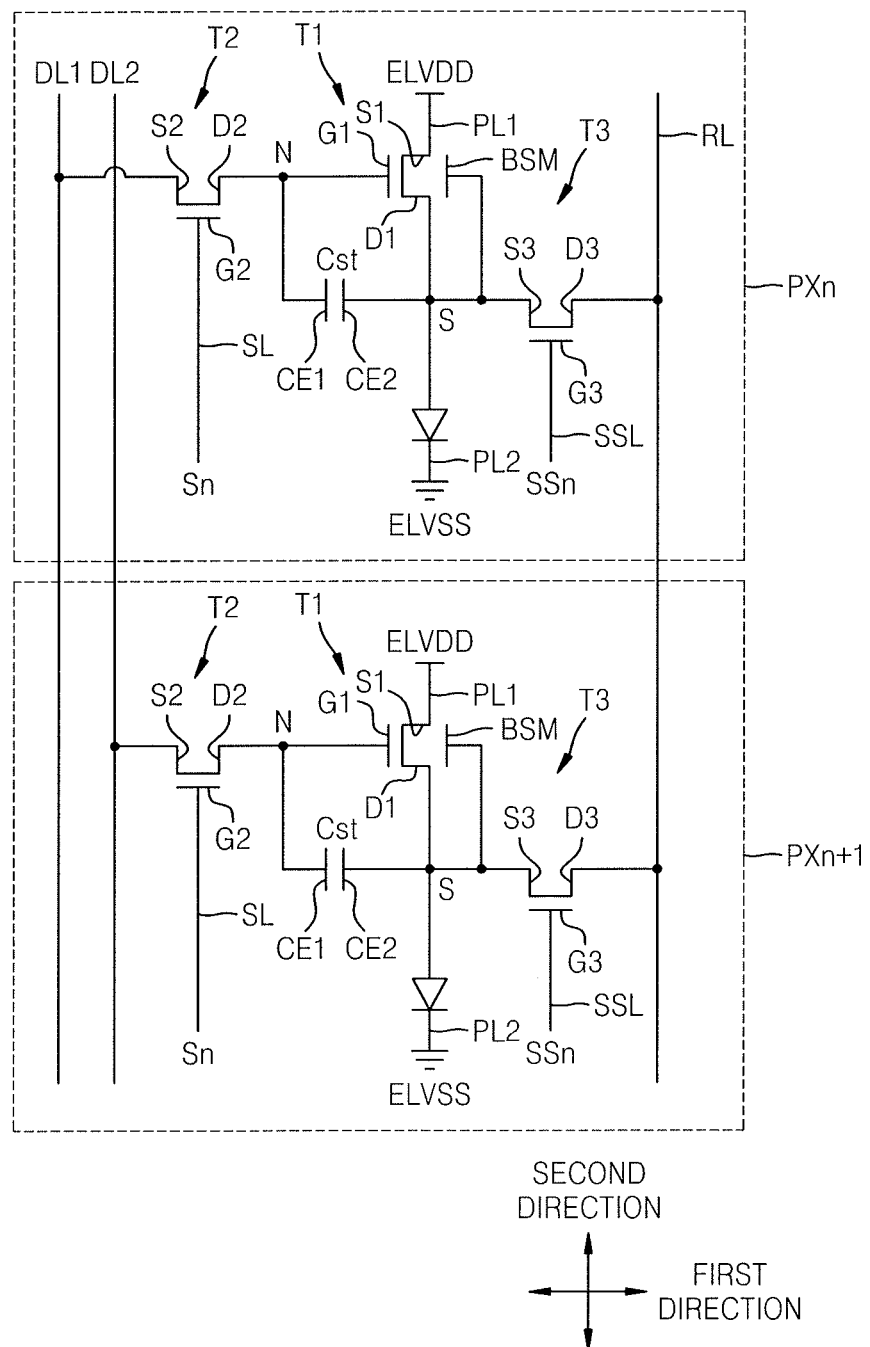
FIG. 10A illustrates an equivalent circuit diagram of two neighboring pixels that may be provided to a display device according to another example embodiment.
Figure 10B:
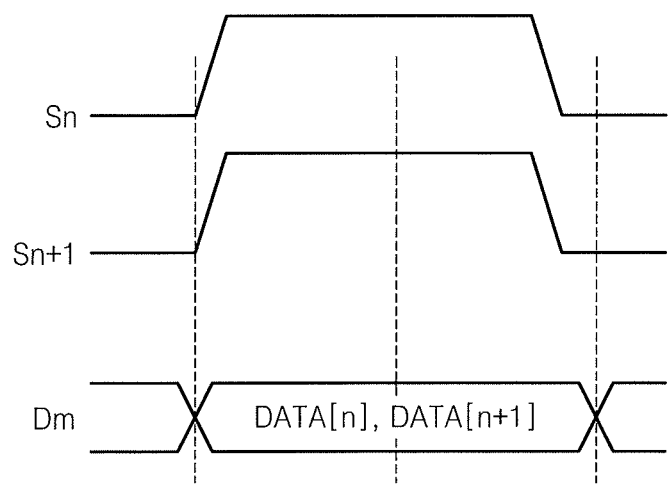
FIG. 10B illustrates a view of a driving timing of a pixel according to FIG. 10A.

FIG. 10A is an equivalent circuit diagram of two neighboring pixels in a display device according to another example embodiment, and FIG. 10B is a view of a driving timing of a pixel according to FIG. 10A.

Referring to FIGS. 10A and 10B, FIG. 10A shows an n-th pixel $PX_n$ and an (n+1)-th pixel $PX_{n+1}$ among pixels arranged in the second direction. The n-th pixel $PX_n$ is connected to a first data line DL1, and the (n+1)-th pixel $PX_{n+1}$ is connected to a second data line DL2. This means that two data lines DL1 and DL2 may correspond to one pixel row arranged in the second direction.

The first data line DL1 may be connected to odd-numbered pixels among the pixels arranged in the second direction, and the second data line DL2 may be connected to even-numbered pixels among the pixels arranged in the second direction.

With such a structure, data (DATA[n] and DATA[n+1]) may be written on each pixel by simultaneously driving scan signals Sn and Sn+1 that are respectively applied to an $n^{th}$ scan line SLn and an $(n+1)^{th}$ scan line SLn+1. Thus, driving of the nth pixel $PX_n$ and driving of the $(n+1)^{th}$ pixel $PX_{n+1}$ may be simultaneously performed and a driving time may be reduced. In a high resolution display, the number of pixels included in the display area DA may increase. A desired driving time may be secured even at high resolution by simultaneously performing the driving of the $n^{th}$ pixel $PX_n$ and the driving of the $(n+1)^{th}$ pixel $PX_n+1$.

Figure 11:
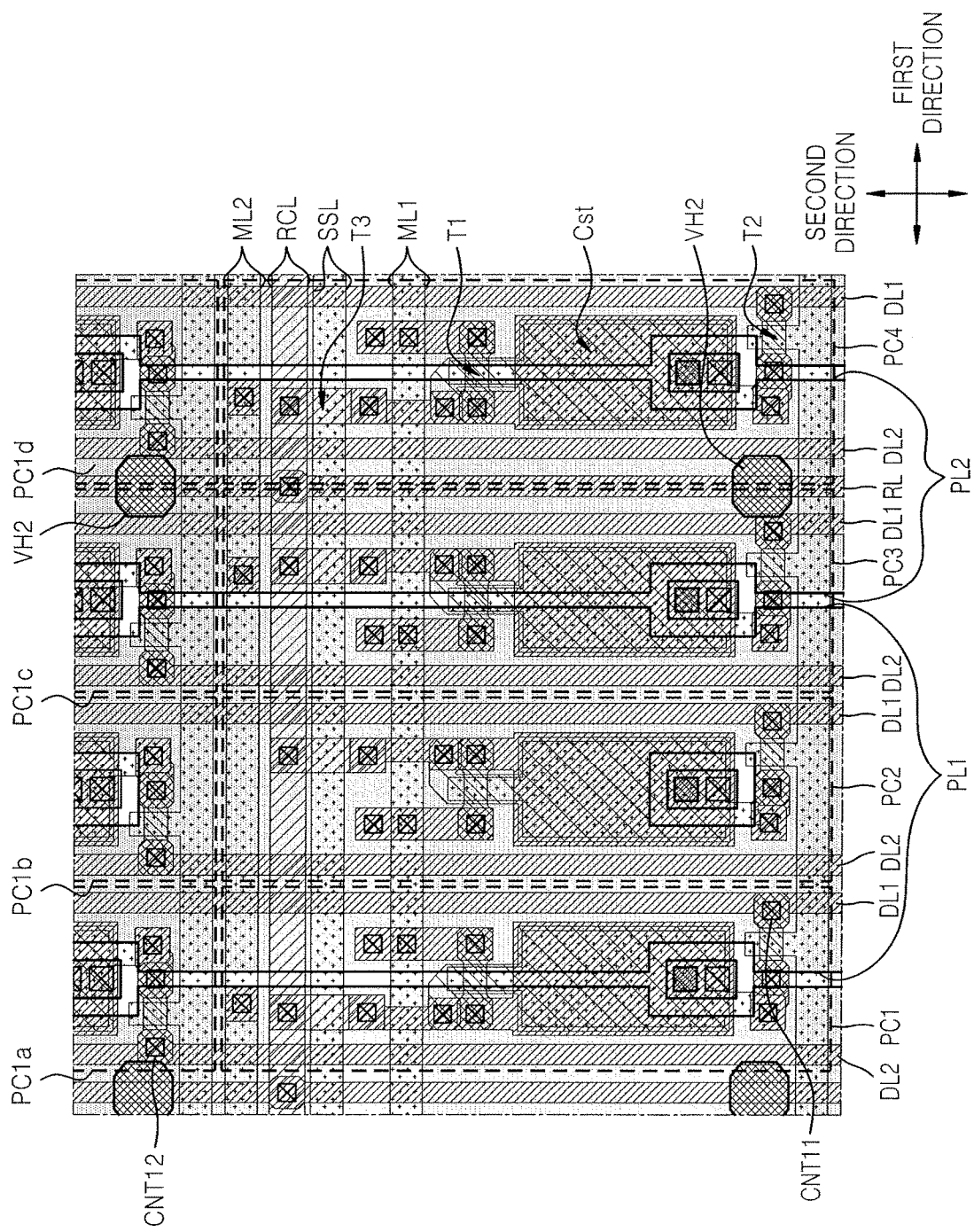
FIG. 11 illustrates a plan view of an arrangement of neighboring pixel circuits included in a display device according to another example embodiment.

FIG. 11 is a plan view of an arrangement of neighboring pixel circuits included in a display device according to another example embodiment.

Referring to FIG. 11, the display device may include a first pixel circuit PC1, a second pixel circuit PC2, a third pixel circuit PC3, and a fourth pixel circuit PC4 arranged in the first direction. Each of the first pixel circuit PC1, the second pixel circuit PC2, the third pixel circuit PC3, and the fourth pixel circuit PC4 may include the driving TFT T1, the switching TFT T2, the sensing TFT T3, and the storage capacitor Cst.

In the present example embodiment, the display device may include the scan line SL, the sensing control line SSL, the first mesh line ML1, the second mesh line ML2, and the reference voltage connection line RCL, each extending in the first direction. The display device may include the first data line DL1, the second data line DL2, the reference voltage line RL, the first power line PL1, and the second power line PL2, each extending in the second direction that intersects with the first direction.

The scan line SL, the sensing control line SSL, the first mesh line ML1, and the second mesh line ML2 may be connected in common to the pixel circuits arranged in the first direction.

The reference voltage line RL that extends in the second direction may be provided one by one to the three pixel circuits PC1, PC2, and PC3, each extending in the first direction. The reference voltage line RL may be connected to the reference voltage connection line RCL that extends in the first direction through a contact hole CNT8 and may transfer a reference voltage in common to the three pixel circuits PC1, PC2, and PC3 that neighbor each other.

The reference voltage line RL may be provided one by one to every two pixel circuits, each extending in the first direction, or may be provided one by one to one pixel circuit. Therefore, the reference voltage connection line RCL may be connected in common to the two pixel circuits, or may be connected to only one pixel circuit.

In the present example embodiment, the data lines DL1 and DL2 may include the first data line DL1 and the second data line DL2 that are alternately connected to pixels arranged in the second direction. Thus, the first data line DL1 may be connected to the first pixel circuit PC1 through a contact hole CNT11. The second data line DL2 may not be connected to the first pixel circuit PC1 and may be connected to a $1a^{th}$ pixel circuit PC1a that neighbors the first pixel circuit PC1 in the second direction through a contact hole CNT12.

In an example embodiment, the first data line DL1 and the second data line DL2 may be arranged in the same layer as a layer of the second electrode CE2 of the storage capacitor Cst. In an example embodiment, the first data line DL1 and the second data line DL2 may be spaced apart from each other with the storage capacitor Cst therebetween.

As described with reference to FIGS. 10A and 10B, a driving time may be reduced by using the first data line DL1 and the second data line DL2, and thus a high resolution display device may be implemented.

The first power line PL1 may overlap at least a portion of the three pixel circuits PC1, PC2, and PC3 that neighbor each other in the first direction. For example, the first power line PL1 may overlap a portion of the first pixel circuit PC1 and a portion of the third pixel circuit PC3 and may overlap an entire region of the second pixel circuit PC2. An area of the first power line PL1 that overlaps the pixel circuits and a width of the first power line PL1 may be variously modified.

The second power line PL2 may overlap at least a portion of the two pixel circuits PC3 and PC4 that neighbor each other in the first direction. For example, the second power line PL2 may overlap a portion of the third pixel circuit PC3 and a portion of the fourth pixel circuit PC4. An area of the second power line PL2 that overlaps the pixel circuits and a width of the second power line PL2 may be variously modified.

The second via hole VH2, which is an area through which the second power line PL2 contacts the opposite electrode 330 (see FIG. 4), may be provided one by one to every three pixel circuits PC1, PC2, and PC3 arranged in the first direction. The second via hole VH2 may be arranged one by one to every two pixel circuits arranged in the first direction. The second via hole VH2 may overlap the reference voltage line RL.

In the present example embodiment, the pixels PX that neighbor each other in the first direction may have a structure that is at least partially symmetric with respect to a virtual line VL or the reference voltage line RL. For example, the first pixel circuit PC1 may include the second pixel circuit PC2 in which the arrangement of the driving TFT T1, the sensing TFT T3, and the storage capacitor Cst has a symmetric structure with respect to a virtual line VL based on the first pixel circuit PC1. The virtual line VL denotes a line extending in the second direction between a first pixel circuit PC1 and a second pixel circuit PC2.

The third pixel circuit PC3 may include the fourth pixel circuit PC4 in which the arrangement of the driving TFT T1, the sensing TFT T3, and the storage capacitor Cst has a symmetric structure with respect to the reference voltage line RL based on the third pixel circuit PC3.

As an example, the arrangement structure of the switching TFT T2 is described as being the same for the first pixel circuit PC1 and the second pixel circuit PC2. In another example, the arrangement structure of the switching TFT T2 of the first pixel circuit PC1 and the arrangement structure of the switching TFT T2 of the second pixel circuit PC2 may be symmetric with respect to a virtual line VL. In an example embodiment, shapes of the pixel circuits PC1, PC2, PC3, and PC4 included in the display device may be different from each other.

Figure 12:
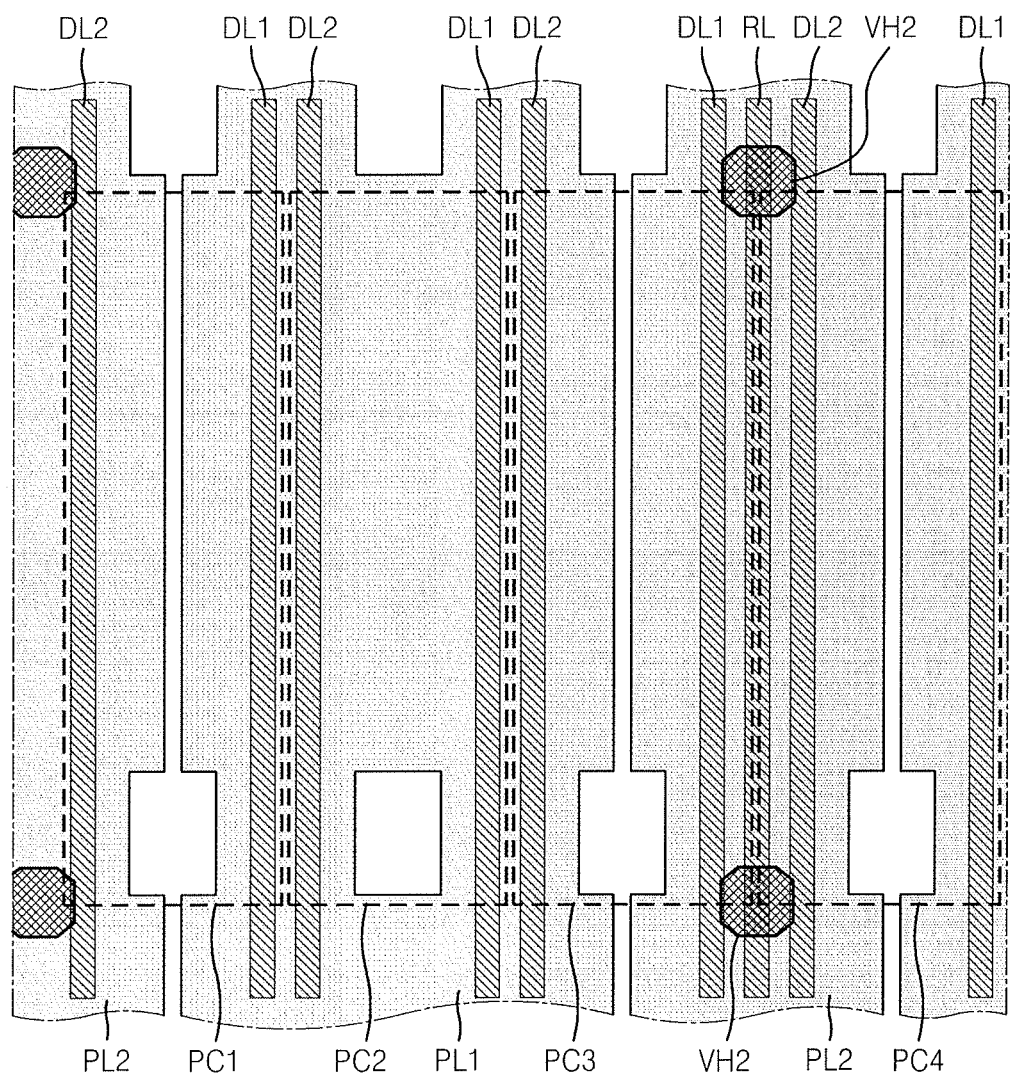
FIGS. 12 to 14 illustrate plan views of an arrangement relation of a first power line, a second power line, a first data line, a second data line, and a reference voltage line according to an example embodiment.
Figure 13:
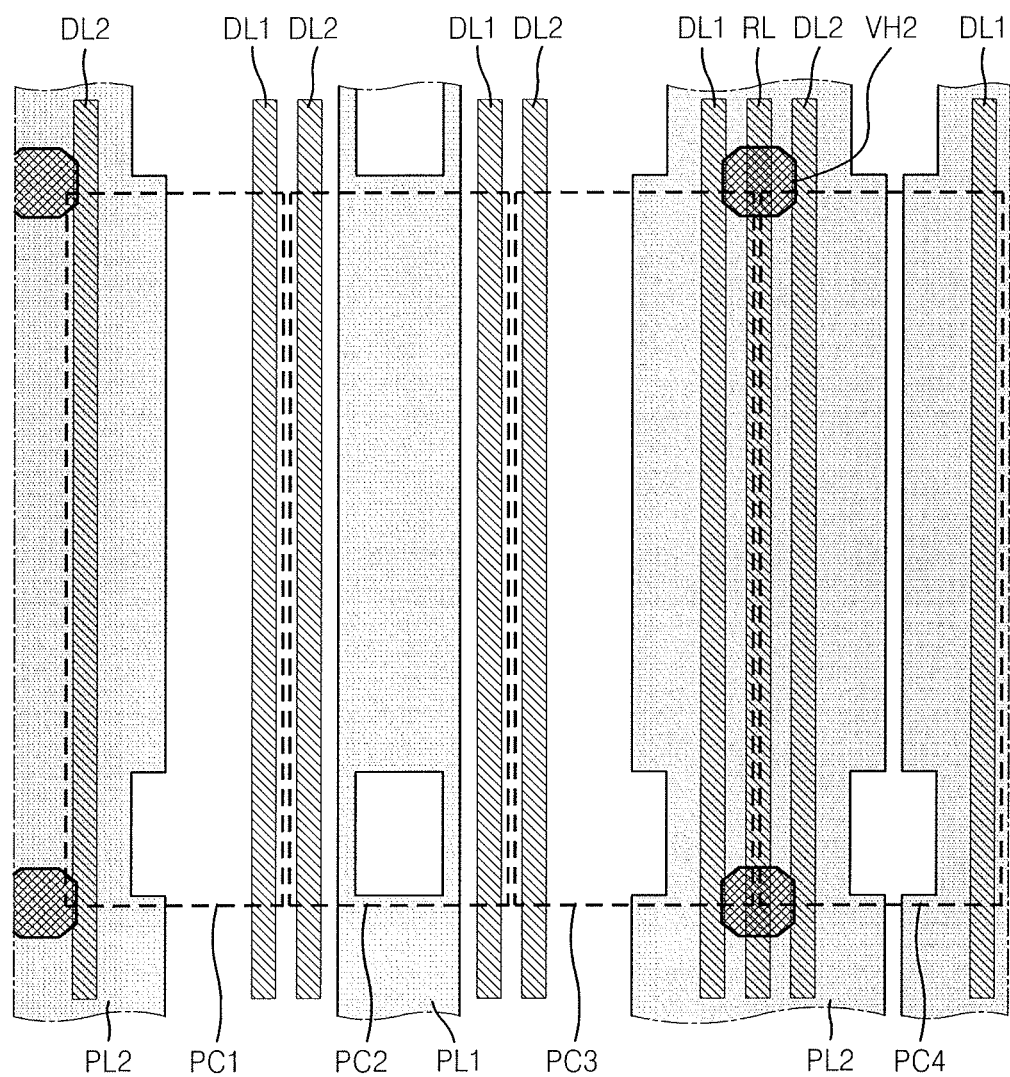
Figure 14:
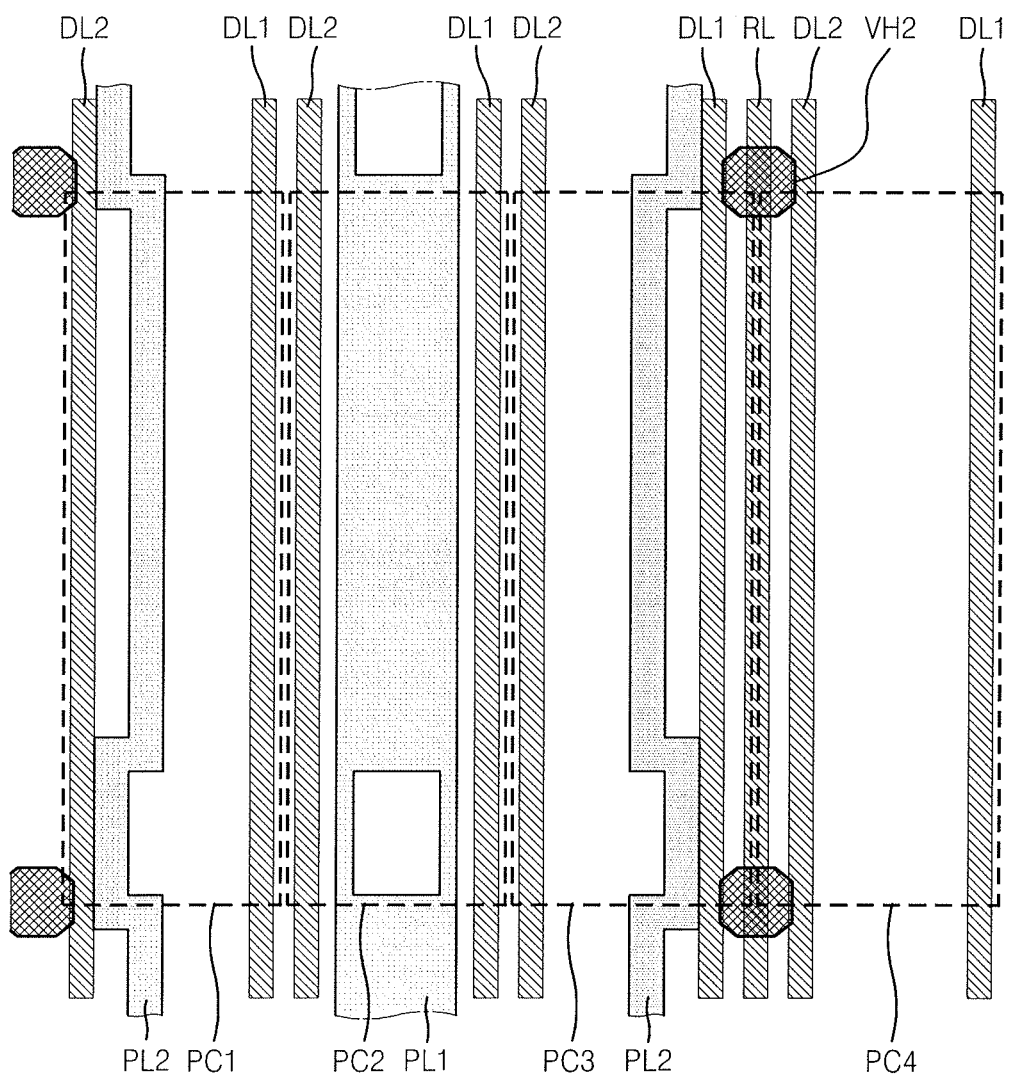

FIGS. 12 to 14 are plan views of an arrangement relation of the first power line PL1, the second power line PL2, the first data line DL1, the second data line DL2, and the reference voltage line RL according to an example embodiment.

Referring to FIG. 12, the first power line PL1 may be arranged over the first interlayer insulating layer 115 (see FIG. 4) and may overlap a plurality of wirings that extend in the second direction. In FIG. 12, one first power line PL1 may overlap four wirings that extend in the second direction. Thus, the first power line PL1 may overlap the first data line DL1 arranged in the first pixel circuit PC1, the first data line DL1 and the second data line DL2 arranged in the second pixel circuit PC2, and overlap the second data line DL2 arranged in the third pixel circuit PC3.

The second power line PL2 may be arranged over the first interlayer insulating layer 115 (see FIG. 4) and may overlap a plurality of wirings that extend in the second direction. In FIG. 12, one second power line PL2 may overlap three wirings that extend in the second direction. Thus, the second power line PL2 may overlap the first data line DL1 and the reference voltage line RL arranged in the third pixel circuit PC3 and overlap the second data line DL2 arranged in the fourth pixel circuit PC4.

The first power line PL1 and the second power line PL2 may cover most of the areas of the pixel circuits of the display device, which may help the first power line PL1 and the second power line PL2 to shield external electric signals.

Referring to FIGS. 13 and 14, at least one of the first power line PL1 and the second power line PL2 may be arranged over the first interlayer insulating layer 115 and may not overlap wirings that extend in the second direction.

For example, as shown in FIG. 13, though the first power line PL1 is arranged over the second pixel circuit PC2, the first power line PL1 may not overlap the first data line DL1 and the second data line DL2. In another implementation, as shown in FIG. 14, both the first power line PL1 and the second power line PL2 may not overlap the first data line DL1, the second data line DL2, and the reference voltage line RL arranged in the pixel circuits. This may help reduce a parasitic capacitance that may occur between the first power line PL1 and the second power line PL2 and the data lines DL1 and DL2.

Figure 15:
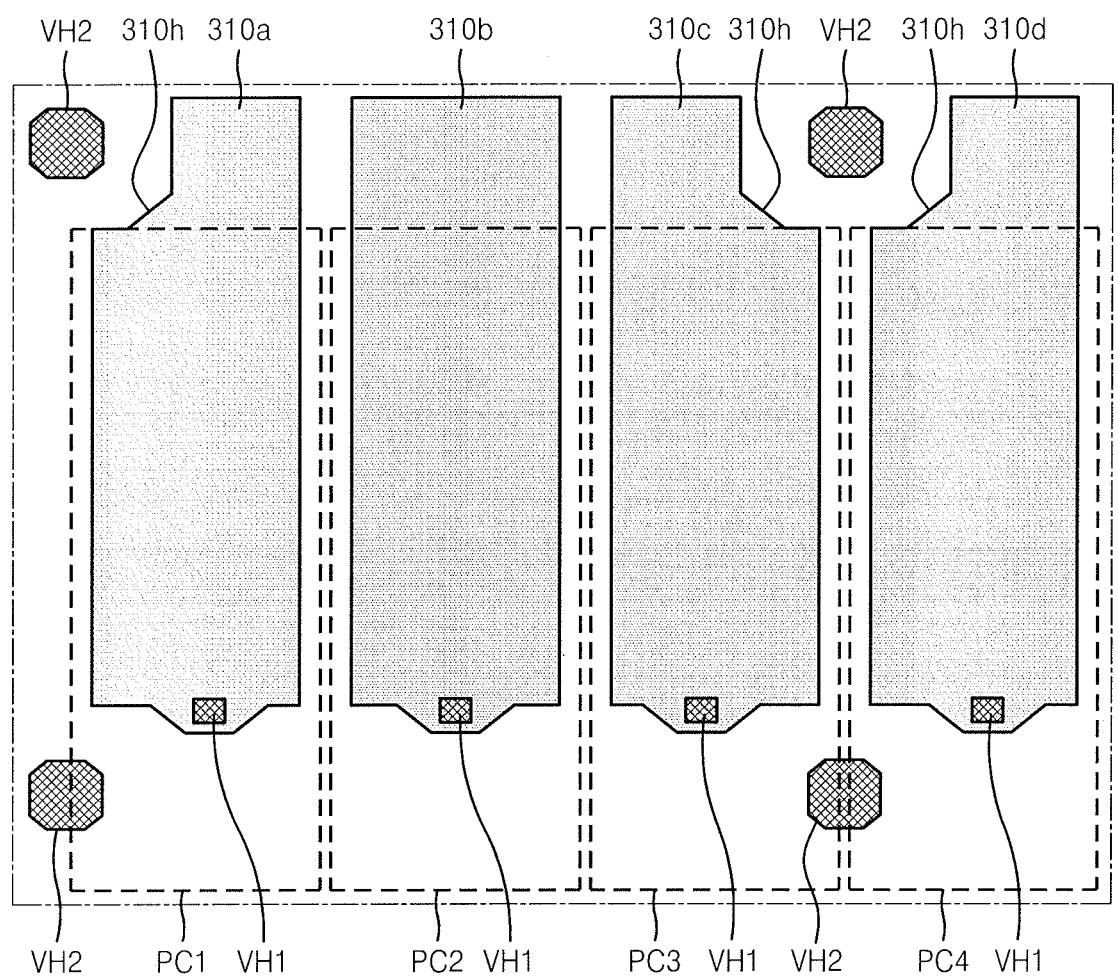
FIG. 15 illustrates a plan view of a shape of a pixel electrode according to an example embodiment.

FIG. 15 is a plan view of a shape of a pixel electrode according to an example embodiment.

In the present example embodiment, shapes of the pixel electrodes 310 included in pixel circuits PC1, PC2, PC3, and PC4 may be variously provided. For example, each of pixel electrodes 310a, 310c, and 310d that neighbor the second via hole VH2 may have a groove 310h indented inward from one side thereof so as to correspond to the shape of the second via hole VH2. The pixel electrodes 310a, 310c, and 310d may be formed also in the shape of the emission area EA due to the groove 310h. The second via hole VH2 may overlap the reference voltage line RL, and the pixel electrode 310c of a third pixel circuit PC3 and the pixel electrode 310d of a fourth pixel circuit PC4 may be symmetric with respect to the reference voltage line RL.

The pixel electrode 310b that does not neighbor the second via hole VH2 may have an approximately rectangular shape, and the emission area EA of the second pixel circuit PC2 may have a rounded rectangular shape. The shape and size of the pixel electrode 310 or the emission area EA may be variously provided.

By way of summation and review, a display device may include a substrate divided into a display area and a peripheral area. The display area may include a scan line and a data line insulated from each other and a plurality of pixels. The display area may include a thin film transistor corresponding to each of the pixels, and a pixel electrode electrically connected to the thin film transistor. The display area may include an opposite electrode provided to the pixels in common. The peripheral area may include various wirings, a scan driver, a data driver, a controller, etc., that are configured to transfer electric signals to the display area.

As described above, embodiments may provide a display device that implements a high-quality image.

As described above, according to an example embodiment, the first power line and the second power line are arranged in a layer different from the data line. Thus, design of the first power line and the second power line may be easily modified while taking into account IR drop and a parasitic capacitance. Also, the second power line may be arranged in a higher layer than that of the data line. Thus, connection to the opposite electrode may be simplified.

As described above, embodiments relate to a display device for implementing a high resolution and a high quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate;
   a switching thin film transistor over the substrate and including a switching semiconductor layer and a switching gate electrode;
   a first insulating layer covering the switching gate electrode;
   a first data line on the first insulating layer;
   a second insulating layer covering the first data line;
   a power line on the second insulating layer;
   a third insulating layer covering the power line; and
   a display element on the third insulating layer and including a pixel electrode, an opposite electrode, and an intermediate layer between the pixel electrode and the opposite electrode, wherein
   the power line at least partially overlaps the switching semiconductor layer or the switching gate electrode, and
   the power line extends in a same direction as the first data line in plan view.

2. The display device as claimed in claim 1, wherein
   the power line comprises a first power line and second power line spaced apart from the first power line in plan view, and the first power line extends in a same direction as the first data line in plan view, is adjacent to the second power line in pin view, and is disposed on a same layer as the second power line.

3. The display device as claimed in claim 2, further comprising:
a driving thin film transistor between the substrate and the display element and including a driving semiconductor layer, a driving gate electrode, a driving source electrode, and a driving drain electrode, wherein
the first power line is connected to the driving source electrode and the second power line is connected to the opposite electrode.

4. The display device as claimed in claim 3, wherein the first power line at least partially overlaps the driving semiconductor layer or the driving gate electrode.

5. The display device as claimed in claim 1, further comprising:
a storage capacitor including a first electrode and a second electrode, wherein:
the power line at least partially overlaps the first electrode or the second electrode of the storage capacitor.

6. The display device as claimed in claim 5, further comprising:
a sensing thin film transistor over the substrate and including a sensing semiconductor layer, a sensing gate electrode, a sensing source electrode, and a sensing drain electrode, wherein the sensing gate electrode or the sensing source electrode is connected to the storage capacitor.

7. The display device as claimed in claim 6, the power line at least partially overlaps the sensing semiconductor layer or the sensing gate electrode.

8. The display device as claimed in claim 1, wherein the power line comprises a first power line and second power line, widths of the first power line and the second power line in a first direction are greater than a width of the first data line in the first direction.

* * * * *